US009685559B2

(12) United States Patent
Duan et al.

(10) Patent No.: US 9,685,559 B2
(45) Date of Patent: Jun. 20, 2017

(54) VERTICALLY STACKED HETEROSTRUCTURES INCLUDING GRAPHENE

(71) Applicant: THE REGENTS OF THE UNIVERSITY OF CALIFORNIA, Oakland, CA (US)

(72) Inventors: Xiangfeng Duan, Los Angeles, CA (US); Woojong Yu, Los Angeles, CA (US); Yuan Liu, Los Angeles, CA (US); Yu Huang, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/654,164

(22) PCT Filed: Dec. 20, 2013

(86) PCT No.: PCT/US2013/077239
§ 371 (c)(1),
(2) Date: Jun. 19, 2015

(87) PCT Pub. No.: WO2014/100723
PCT Pub. Date: Jun. 26, 2014

(65) Prior Publication Data
US 2015/0318401 A1    Nov. 5, 2015

Related U.S. Application Data

(60) Provisional application No. 61/745,102, filed on Dec. 21, 2012, provisional application No. 61/765,655, filed on Feb. 15, 2013.

(51) Int. Cl.
*H01L 29/786*    (2006.01)
*H01L 29/417*    (2006.01)
(Continued)

(52) U.S. Cl.
CPC ...... *H01L 29/7869* (2013.01); *H01L 29/1606* (2013.01); *H01L 29/41733* (2013.01);
(Continued)

(58) Field of Classification Search
CPC ............. H01L 29/7869; H01L 29/1606; H01L 29/41733; H01L 29/41775; H01L 29/45;
(Continued)

(56) References Cited

U.S. PATENT DOCUMENTS 7,482,652 B1 *  1/2009  Yang ...................... B82Y 10/00
                                                        257/183
2009/0166686 A1  7/2009  Hunt et al.
(Continued)

FOREIGN PATENT DOCUMENTS

JP    2009-277803    11/2009

OTHER PUBLICATIONS

Yu et al. "Vertically stacked multi-heterostructures of layered materials for logic transistors and complementary inverters," Nature Materials, vol. 12, pp. 246-252 (2012).
(Continued)

*Primary Examiner* — Fernando L Toledo
*Assistant Examiner* — Neil Prasad
(74) *Attorney, Agent, or Firm* — Foley & Lardner LLP; Cliff Z. Liu

(57) ABSTRACT

A vertically stacked heterostructure device includes: (1) a substrate; and (2) vertically stacked layers disposed over the substrate and including (a) a source electrode including a layer of graphene; (b) a drain electrode; and (c) a semiconducting channel disposed between the source electrode and the drain electrode. During operation of the device, a current is configured to flow between the source electrode and the drain electrode through the semiconducting channel.

20 Claims, 18 Drawing Sheets

(51) Int. Cl.
*H01L 29/45* (2006.01)
*H01L 31/113* (2006.01)
*H01L 31/032* (2006.01)
*H01L 31/0224* (2006.01)
*H01L 29/16* (2006.01)
*H01L 29/66* (2006.01)

(52) U.S. Cl.
CPC ........ *H01L 29/41775* (2013.01); *H01L 29/45* (2013.01); *H01L 29/66742* (2013.01); *H01L 29/66969* (2013.01); *H01L 29/78642* (2013.01); *H01L 29/78681* (2013.01); *H01L 29/78684* (2013.01); *H01L 29/78693* (2013.01); *H01L 29/78696* (2013.01); *H01L 31/022408* (2013.01); *H01L 31/032* (2013.01); *H01L 31/113* (2013.01)

(58) Field of Classification Search
CPC ......... H01L 29/66742; H01L 29/66969; H01L 29/78642; H01L 29/78681; H01L 29/78684; H01L 29/78693; H01L 29/78696; H01L 31/022408; H01L 31/032; H01L 31/113

See application file for complete search history.

(56) References Cited

U.S. PATENT DOCUMENTS

| | | |
|---|---|---|
| 2009/0302310 A1 | 12/2009 | Rinzler et al. |
| 2011/0042650 A1 | 2/2011 | Avouris et al. |
| 2013/0020707 A1* | 1/2013 | Or-Bach ................ B82Y 10/00 257/741 |
| 2013/0214252 A1* | 8/2013 | Park ....................... B82Y 30/00 257/29 |

OTHER PUBLICATIONS

International Search Report for International Application No. PCT/US2013/077239 dated Apr. 15, 2014.
Britnell et al., "Field-Effect Tunneling Transistor Based on Vertical Graphene Heterostructures," Science, 335, pp. 947-950 (2012).

* cited by examiner

VERTICALLY STACKED HETEROSTRUCTURES INCLUDING GRAPHENE

CROSS-REFERENCE TO RELATED APPLICATIONS

This application is a National Stage Entry of PCT/US2013/077239, filed Dec. 20, 2013, which claims the benefit of U.S. Provisional Application Ser. No. 61/745,102 filed on Dec. 21, 2012, and the benefit of U.S. Provisional Application Ser. No. 61/765,655, filed on Feb. 15, 2013, the disclosures of which are incorporated herein by reference in their entirety.

STATEMENT REGARDING FEDERALLY SPONSORED RESEARCH OR DEVELOPMENT

This invention was made with Government support under Grant Number DMR0956171, awarded by the National Science Foundation. The Government has certain rights in the invention.

FIELD OF THE INVENTION

This disclosure generally relates to heterostructures and, more particularly, to vertically stacked heterostructures including graphene for diverse applications in electronics and optoelectronics.

BACKGROUND

Layered materials such as graphene have attracted considerable interest for potential applications in diverse electronic and optoelectronic devices, including transistors, inverters, photodetectors, photovoltaic devices, ultrafast lasers, polarizers, touch panels, and optical modulators. Unfortunately, the lack of a bandgap in graphene has constrained the on-off current ratio of graphene-based transistors for logic applications. Some attempts made to address this challenge have yielded improvements in the on-off ratio of resulting devices, but often at a severe sacrifice of a deliverable current density.

Also, with a broad spectral absorption, high carrier mobility, and short carrier lifetime, graphene exhibits exciting potential for wideband, high speed photodetection. However, the design of graphene-based photodetectors currently relies on a lateral graphene-metal junction with a rather small photoresponsive active area, which is not ideal for efficient photon harvesting. Additionally, the weak absorption characteristics and small built-in potential in these graphene-based photodetectors have severely limited their external quantum efficiency (EQE) in the range of about 0.1-1%.

It is against this background that a need arose to develop the vertically stacked heterostructures including graphene described herein.

SUMMARY

One aspect of this disclosure relates to a vertically stacked heterostructure device. In one embodiment, the device includes: (1) a substrate; and (2) vertically stacked layers disposed over the substrate and including (a) a source electrode including a layer of graphene; (b) a drain electrode; and (c) a semiconducting channel disposed between the source electrode and the drain electrode. During operation of the device, a current is configured to flow between the source electrode and the drain electrode through the semiconducting channel.

Another aspect of this disclosure relates to a method of photocurrent generation. In one embodiment, the method includes: (1) providing a vertical stack of layers disposed over a substrate, wherein the vertical stack of layers includes a top electrode, a bottom electrode, and a semiconducting channel disposed between the top electrode and the bottom electrode, and at least one of the top electrode and the bottom electrode includes a layer of graphene; and (2) generating a photocurrent by illuminating the vertical stack of layers, wherein the photocurrent flows between the top electrode and the bottom electrode through the semiconducting channel, and generating the photocurrent includes applying a back gate voltage to the substrate to modulate the photocurrent.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Electronic Devices

Some embodiments of this disclosure are directed to the integration of vertically stacked multi-heterostructures of layered materials (e.g., graphene, molybdenum disulfide $MoS_2$, or cobaltites $Bi_2Sr_2Co_2O_8$) to provide high current density vertical field-effect transistors (VFETs). In some embodiments, an n-channel VFET is created by employing graphene or a metal thin film as source-drain electrodes and a vertically sandwiched few-layer $MoS_2$ as a semiconducting channel. Electrical transport studies demonstrate the VFETs exhibit n-channel characteristics with a room temperature on-off ratio>$10^3$, sufficient for logic applications. Of note, with an Ohmic contacted metal top-electrode and an ultrathin $MoS_2$ layered semiconductor, the devices can deliver a high current density up to about 5,000 A/cm² (or more), about 2-5 orders of magnitude larger than vertical tunneling transistors or barristors. Some embodiments provide a general strategy for the vertical integration of various layered materials to obtain both p- and n-channel transistors for logic applications. Taking a step further, other embodiments are directed to a complementary inverter with larger than unit voltage gain by vertically stacking layered materials of graphene, $Bi_2Sr_2Co_2O_8$ (p-channel), graphene, $MoS_2$ (n-channel), and metal thin film in sequence. The ability to simultaneously achieve high on-off ratio, high current density, and logic integration in vertically stacked multi-heterostructures can open up a new dimension for electronics to allow three-dimensional integration.

As will be understood, graphene is an allotrope of carbon, and its structure is typically one-atom-thick sheets of $sp^2$-bonded carbon atoms that are packed in a honeycomb crystal lattice. In some embodiments, graphene is provided in the form of graphene nanoribbons or thin strips of substantially a monolayer of carbon atoms that can be envisioned as unrolled carbon nanotubes, although a bilayer or other multilayer of graphene is also contemplated. The graphene is vertically stacked in conjunction with a layered material, which can be semiconducting and can effectively function as a semiconducting channel for VFETs. Examples of suitable layered materials include layered transition metal dichalcogenides having the chemical formula $MX_2$, where M is a transition metal and X stands for S, Se or Te. Particular examples are transition metal dichalcogenides in which the transition metal M is Mo or W. A transition metal dichalcogenide can be in the form of an atomically thin monolayer of a metal atom layer sandwiched between two chalcogenide atom layers, although a bilayer or other multilayer of a transition metal dichalcogenide is also contemplated. Additional examples of suitable layered materials include layered transition metal oxides, such as cobaltites $Bi_2Sr_2CO_2O_8$ (BSCO).

Figure 1:
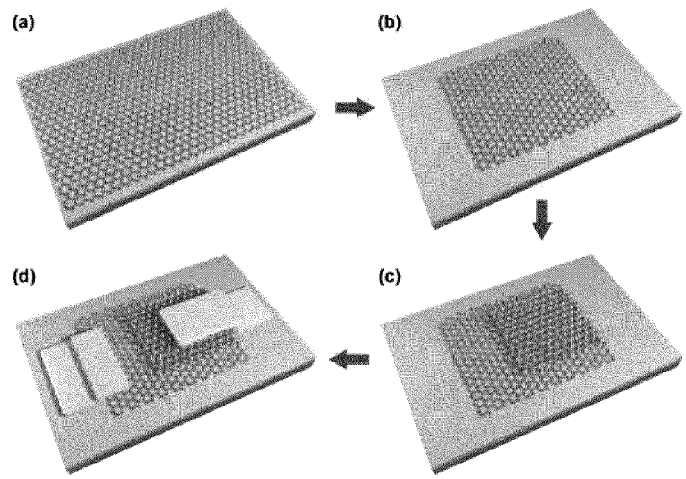
FIG. 1: a, Chemical vapor deposition (CVD) grown monolayer graphene is transferred on 300 nm $SiO_2$ covered silicon substrate. b, Graphene is patterned by oxygen plasma etching using photoresist as an etching mask. c, $MoS_2$ layer is exfoliated onto the graphene through a micromechanical cleavage approach. d, Ti/Au (50 nm/50 nm) is patterned as a grounded, top electrode for a vertical field-effect transistor (VFET) and electrode contact for graphene using e-beam lithography.
Figure 2:
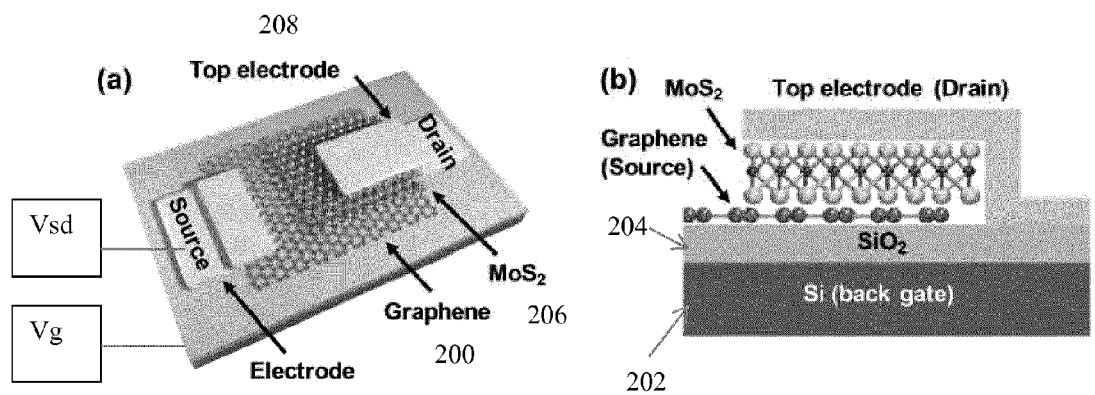
FIG. 2: Schematic illustration of a vertically stacked graphene-$MoS_2$-metal field-effect transistor. a, A schematic of the three-dimensional view of the device layout. b, A schematic of the cross-sectional view of the device, with the graphene and top metal thin film functioning as the source and drain electrodes, the $MoS_2$ layer as the vertically stacked semiconducting channel and its thickness defining the channel length. Silicon back gate is used with 300 nm $SiO_2$ dielectric layer.

An embodiment of a fabrication procedure for a VFET is schematically illustrated in FIG. 1, and an embodiment of the resulting VFET is schematically illustrated in FIG. 2. Monolayer graphene is first grown by chemical vapor deposition (CVD) and transferred onto a silicon wafer 202 with about 300 nm thick $SiO_2$ layer 204 (or another suitable substrate with a dielectric layer) (FIG. 1a). Next, the graphene is patterned into strips of about 10 μm width and about 50 μm length by oxygen plasma etching through a photo resist mask to serve as a bottom source electrode 200 (FIG.

1b). Micromechanical cleavage is used to exfoliate few-layer MoS$_2$ onto the patterned graphene as a semiconducting channel 206 (FIG. 1c). Another layered material or other semiconducting material can be used in place of, or in combination with, MoS$_2$. A thickness of the semiconducting MoS$_2$ channel 206 can be at least about 9 nm, at least about 16 nm, at least about 24 nm, or at least about 32 nm, and up to about 40 nm or more, although thicknesses less than 9 nm are also contemplated. A top metal drain electrode 208 is patterned on the MoS$_2$ to overlap with the bottom graphene electrode by e-beam lithography and e-beam deposition of Ti/Au (about 50 nm/about 50 nm) (or another layer or set of layers of a metal, a highly doped semiconductor, or other electrically conductive material) (FIG. 1d). Along with the top metal drain electrode 208, a bottom source electrode contact 210 is patterned on the bottom graphene electrode 200 by e-beam lithography and e-beam deposition of Ti/Au (about 50 nm/about 50 nm) (or another layer or set of layers of a metal, a highly doped semiconductor, or other electrically conductive material) (FIG. 1d). It is also contemplated that a top graphene drain electrode can be included in place of the top metal drain electrode 208.

In the illustrated embodiment, a voltage source is connected to the bottom graphene electrode 200 to apply a source-drain voltage $V_{sd}$, a voltage source is connected to the silicon wafer 202 to apply a back gate voltage $V_g$, and the top metal drain electrode 208 is connected to ground. During operation of the VFET, current flows between the bottom graphene electrode 200 and the top metal electrode 208 through the semiconducting MoS$_2$ channel 206, which is modulated by the silicon back gate 202 (FIGS. 2a,b). Because of the finite density of states and weak screening effect by the monolayer graphene, the applied back gate electric field can effectively penetrate through graphene to modulate the energy band of MoS$_2$.

Advantageously, resulting VFETs, such as those fabricated according to FIG. 1 and FIG. 2, can exhibit a number of improved performance characteristics. For example, a VFET can have an on-current density of at least about 100 A/cm$^2$, at least about 500 A/cm$^2$, at least about 1,000 A/cm$^2$, at least about 1,500 A/cm$^2$, at least about 2,000 A/cm$^2$, at least about 2,500 A/cm$^2$, or at least about 2,600 A/cm$^2$, and up to 5,000 A/cm$^2$ or more, as measured at, for example, a source-drain voltage $V_{sd}$ of −0.1 V, −0.2 V, −0.5 V, or −1 V and a gate voltage $V_g$ of 0 V, 20 V, 40 V, or 60 V. Also, the VFET can have a room temperature on-off current ratio of at least about 10, at least about 50, at least about 100, at least about 500, at least about 1,000, at least about 1,100, at least about 1,200, at least about 1,300, or at least about 1,400, and up to about 1,500 or more, as measured at, for example, a source-drain voltage $V_{sd}$ of −0.1 V, −0.2 V, −0.5 V, or −1 V.

Figure 3:
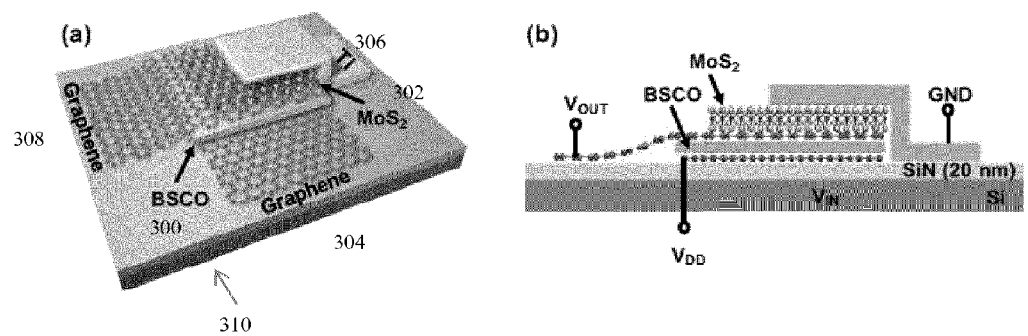
FIG. 3: Vertically stacked multi-heterostructures of layered materials for complementary inverters. a, Three dimensional schematic illustration of a complementary inverter by vertically stacking layered materials of graphene, $Bi_2Sr_2Co_2O_8$ (BSCO) (p-channel), graphene, $MoS_2$ (n-channel), and a metal thin film on $Si/SiN_x$ (20 nm) substrate. b, Cross-sectional view of the vertically stacked inverter.
Figure 4:
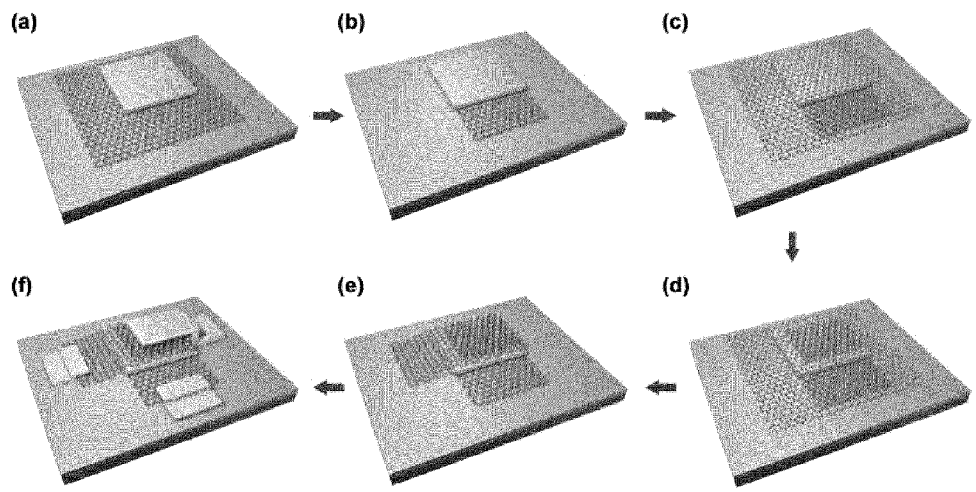
FIG. 4: a, CVD grown monolayer graphene is transferred on 20 nm SiN covered silicon substrate, and BSCO layer is exfoliated onto the graphene through a micromechanical cleavage approach. b, Bottom layer graphene is patterned by oxygen plasma etching using e-beam resist as an etching mask. BSCO is doped by oxygen during oxygen plasma treatment. c, Second layer of graphene is transferred onto the BSCO. d, To stack $MoS_2$ layer, $MoS_2$ is first exfoliated on a $SiO_2$/Si substrate. Polymethyl-methacrylate (PMMA) is spin coated on the substrate and then the sample is dipped into a buffered oxide etch (BOE) solution. Once the $SiO_2$ layer has dissolved by the BOE solution, extremely hydrophobic PMMA floats on the BOE solution. The PMMA membrane is transferred with de-ionized water to rinse the BOE solution and then transferred onto the vertical stack inverter. The PMMA is dissolved in acetone after transferring the $MoS_2$ layer. e, Second layer graphene is patterned by oxygen plasma using e-beam resist as an etching mask. f, Ti/Au (50 nm/50 nm) is patterned to form a grounded, top electrode for the inverter and electrode contacts for top and bottom graphene layers by using e-beam lithography.
Figure 19:
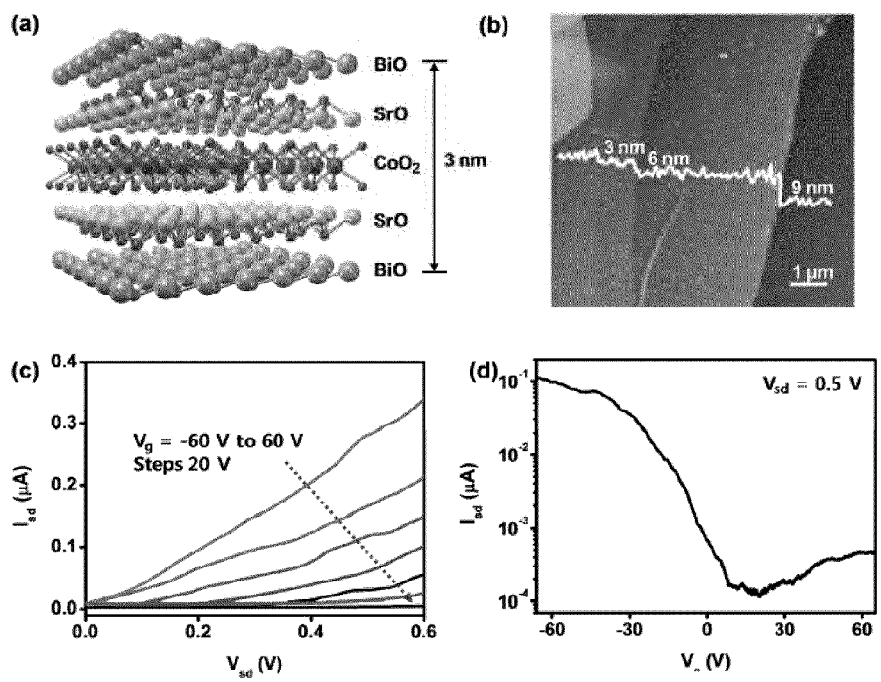
FIG. 19: a, Schematic image of Bi$_2$Sr$_2$Co$_2$O$_8$ (BSCO). BSCO is a layered material composed of five layers of BiO, SrO, CoO$_2$, SrO, and BiO. b, AFM image of an exfoliated BSCO flake. c, Output characteristics of a planar BSCO FET on Si/SiO$_2$ (300 nm) substrate. The back gate voltage is varied from −60 V (top) to 60 V (bottom) in the step of 20 V. d, Transfer characteristics of BSCO FET at V$_{sd}$=0.5 V.

The strategy of vertical integration is general and can be extended to various layered materials to obtain vertically stacked devices with both n- and p-channel characteristics. For example, layered transition metal oxides such as BSCO can be exfoliated into a single layer or a few layers and exhibit p-channel characteristics (FIG. 19). Taking a step further, multiple layers of layered materials can be vertically stacked to provide more complicated device functions. To this end, an embodiment of this disclosure is directed to a complementary inverter by vertically stacking multi-heterostructures of layered materials including graphene, BSCO (p-channel), graphene, MoS$_2$ (n-channel), and a metal thin film on Si/SiN$_x$ (20 nm) substrate 310 (or another suitable substrate with a dielectric layer) (FIGS. 3a,b and FIG. 4). In this complementary inverter, a vertically stacked BSCO layer 300 functions as a p-channel VFET, and a vertically stacked MoS$_2$ layer 302 functions as a n-channel VFET. Supply voltage $V_{DD}$ (or $V_{sd}$) is applied to a bottom graphene layer 304, and a top metal electrode 306 is connected to ground. Output voltage is measured on an intermediate graphene layer 308 as a function of input voltage applied to the silicon back gate. Other layered materials or other semiconducting materials can be used in place of, or in combination with, MoS$_2$ and BSCO.

As further explained in the Examples that follow, electrical measurements show that the vertically stacked BSCO layer 300 with bottom and top graphene layers 304 and 308 exhibits p-channel characteristics. Of note, the top stack of n-channel MoS$_2$ VFET retains excellent switching characteristics, demonstrating the bottom gate electrical field can readily penetrate through the thin bottom p-channel device to effectively modulating the top n-channel VFET. In this way, the vertically stacked multi-heterostructures effectively form a complementary inverter with a large than unit voltage gain of about 1.7. More generally, the voltage gain can be at least or greater than 1, at least about 1.1, at least about 1.2, at least about 1.3, at least about 1.4, at least about 1.5, or at least about 1.6, and up to about 1.7 or more.

Photodetection and Photocurrent Generation

Some embodiments of this disclosure are directed to vertically stacked heterostructures of layered materials for highly efficient photodetection and photocurrent generation. In some embodiments, vertically stacked graphene-MoS$_2$-graphene and graphene-MoS$_2$-metal junctions can be created with a broad area vertical junction for highly efficient photon harvesting. The weak electrostatic screening effect of graphene allows integration of single or dual gates under, above, or both under and above the vertical heterostructure to modulate the band slope in MoS$_2$ and manipulate the charge generation, separation and transportation processes. Unlike other photodiodes in which a photocurrent is dictated by an internal built-in potential, the amplitude and polarity of a photocurrent in gated vertical heterostructures can be modulated by an external gate field. In this way, the photocurrent of the vertical devices can be modulated by more than 500 times to achieve an EQE of about 55% (or more), significantly higher than that of lateral graphene-metal junction photodetectors.

Figure 5:
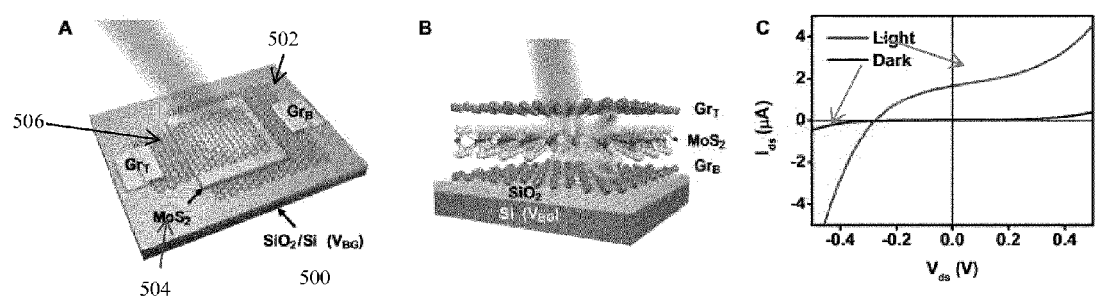
FIG. 5: (A) A schematic illustration of a three-dimensional view of a device layout. (B) A schematic illustration of a side view of the device, with a semiconducting $MoS_2$ layer sandwiched between top and bottom graphene electrodes. A silicon substrate is used as a back gate electrode with 300 nm $SiO_2$ as a dielectric layer. (C) Experimental current-voltage characteristic of the vertically stacked device in the dark and under illumination by a focused 514 nm laser beam (80 µW power, 1 µm spot size).
Figure 6:
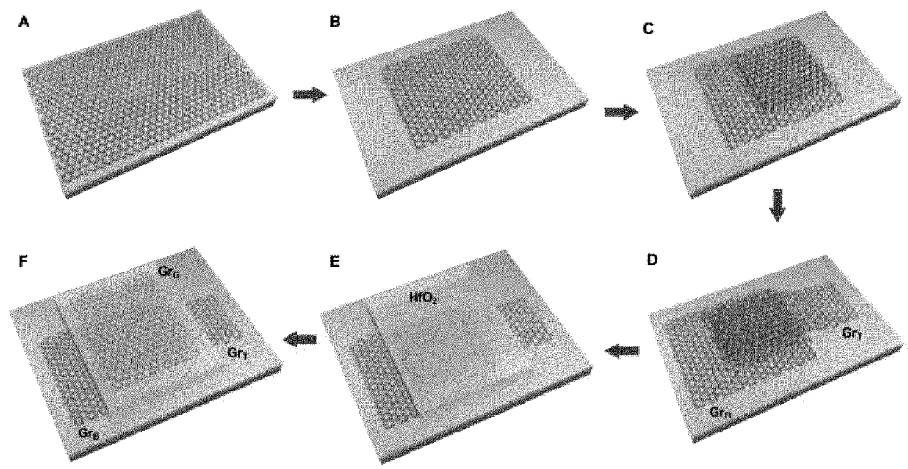
FIG. 6: (A) CVD grown monolayer graphene is transferred on 300 nm $SiO_2$ covered silicon substrate. (B) Bottom graphene is patterned by oxygen plasma etching using photoresist as an etching mask. (C) $MoS_2$ layer is exfoliated onto the graphene through a micromechanical cleavage approach. (D) Top graphene electrode is transferred and patterned on the $MoS_2$ to overlap with $MoS_2$ and bottom graphene. (E, F) For dual gate heterostructures, a 60 nm $HfO_2$ dielectric layer is deposited by e-beam evaporation, followed by transferring of a top gate graphene electrode.

FIG. 5 is a schematic illustration of an embodiment of a graphene-MoS$_2$-graphene vertical heterostructure device on a Si/SiO$_2$ substrate 500 (or another suitable substrate with a dielectric layer), and FIG. 6 is a schematic illustration of an embodiment of a fabrication procedure for the vertical heterostructure device. For the fabrication of the vertical heterostructure device, graphene is grown with a CVD process and transferred onto the Si/SiO$_2$ (300 nm SiO$_2$) substrate 500, and patterned into about 8 μm×about 30 μm strips as a bottom electrode 502 using a photolithography and oxygen plasma etching process (FIGS. 6A,B). A MoS$_2$ flake 504 is then exfoliated onto the graphene strip through a micromechanical cleavage approach (FIG. 6C). Another layered material or other semiconducting material can be used in place of, or in combination with, MoS$_2$. A top graphene electrode 506 is transferred and patterned on the MoS$_2$ flake 504 on the bottom graphene electrode 502 (FIG. 6D). The directly overlapping graphene area is etched away to avoid shorting between the top and bottom graphene. Metal electrodes, for probe contact or wire bonding purposes, are patterned on the bottom and top graphene electrodes 502 and 506 by e-beam lithography and e-beam deposition of Ti/Au (about 50 nm/about 50 nm) (or another layer or set of layers of a metal, a highly doped semiconductor, or other electrically conductive material). A confocal laser, sunlight, other light source can be used to excite the device to generate electron-hole pairs in the MoS$_2$ layer 504, which can be separated by the asymmetric potential in top graphene-MoS$_2$ and bottom graphene-MoS$_2$ junction to produce a photocurrent. (FIGS. 5A, B). A current-voltage (I-V) data of the vertical heterostructure obtained in the dark (lower line) and under 514 nm laser irradiation (upper line) show photoresponse with an open circuit voltage of about 0.3 V and a short circuit current of about 2 µA (FIG. 5C).

Advantageously, resulting vertical heterostructure devices, such as those fabricated according to FIG. 5 and FIG. 6, can exhibit a number of improved performance characteristics. For example, a vertical heterostructure device can generate a photocurrent to achieve an EQE of at least about 6%, at least about 7%, at least about 8%, at least about 11%, at least about 13%, at least about 15%, at least about 20%, at least about 25%, or at least about 27%, and up to about 55% or more, as measured at, for example, when subjected to laser illumination (514 nm, 1 µm spot size) at a power of 5 µW, 20 µW, 40 µW, 60 µW, or 80 µW, and when subjected to a back gate voltage $V_{BG}$ of −60 V, −40 V, −20 V, 0 V, 20 V, 40 V, or 60 V. Also, the photocurrent generated by the vertical heterostructure device can be modulated by tuning the back gate voltage $V_{BG}$, such as within a range of −60 V to 60 V, −40 V to 40 V, −20 V to 20 V, −60 V to 0 V, −40 V to 0 V, −20 V to 0 V, 0 V to 60 V, 0 V to 40 V, or 0 V to 20 V.

Figure 24:
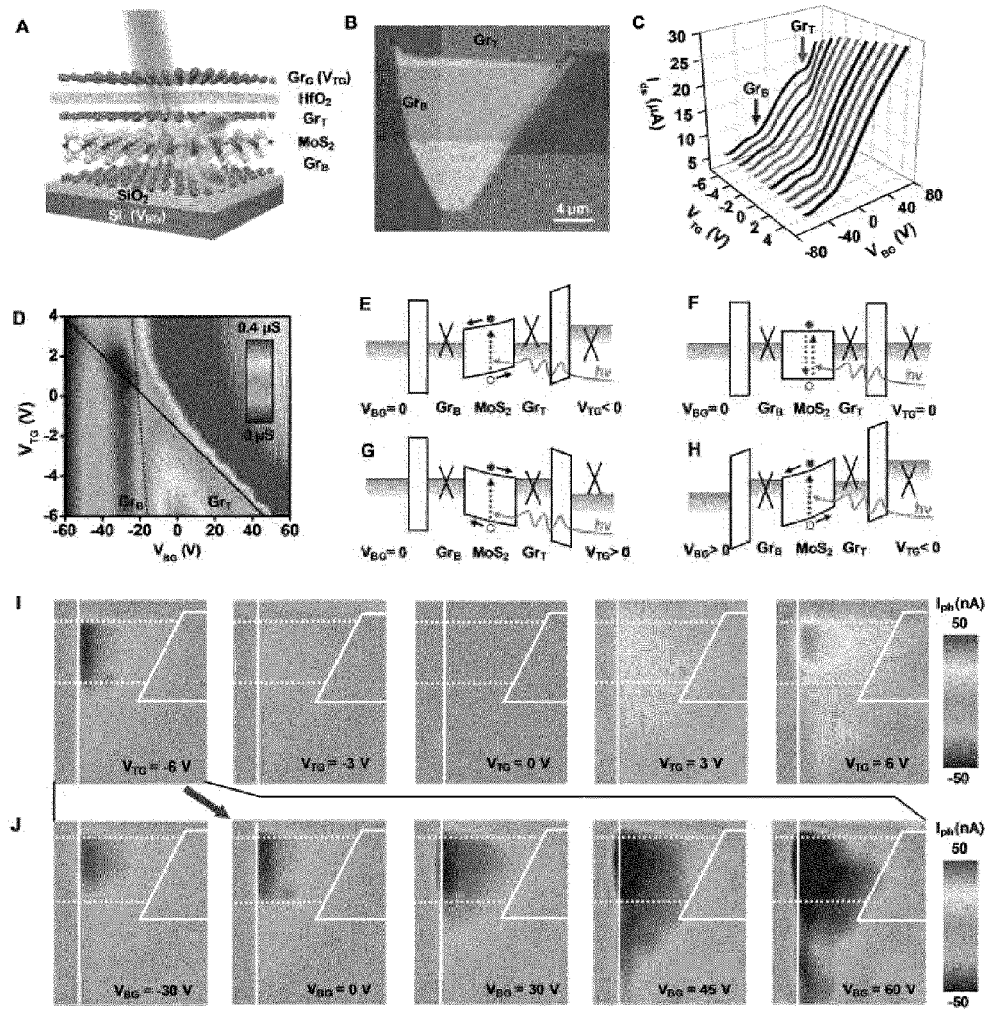
FIG. 24: (A) A schematic illustration of a side view of a device, with a MoS$_2$ layer sandwiched between top and bottom graphene electrodes, a silicon substrate as a back gate electrode with 300-nm SiO$_2$ dielectric layer, and another graphene layer as a top gate electrode with a 60-nm HfO$_2$ gate dielectric. (B) Optical image of a dual-gated device. (C) Transfer characteristics of the dual-gated vertical heterostructure device as a function of V$_{BG}$ (−60 V to +60 V) at various V$_{TG}$ (−6 V to +4 V). V$_{ds}$ was applied at 100 mV. (D) Two-dimensional plot of the transconductance (dI$_{ds}$/dV$_{BG}$) of the dual-gated vertical heterostructure device. The Dirac points of top graphene and bottom graphene are shown by solid line and dashed line, respectively, (E, F, G) Schematic band diagrams of the dual-gated vertical heterostructure device with negative, zero and positive top gate bias at zero back gate bias. (H) Schematic band diagrams of the device with negative top gate bias and positive back gate bias to further enhance the band slope and overall photocurrent. (I) Scanning photocurrent images taken at variable V$_{TG}$ (−6 to +6 V) and zero V$_{BG}$ (514 nm laser excitation with 80 µN power and 1 µm laser spot size). The dashed line and solid lines indicate the edge of the bottom graphene and top graphene electrodes, respectively. (J) Scanning photocurrent images taken at variable V$_{BG}$ (−30 to +60 V) and V$_{TG}$=−6 V.

Other embodiments of vertically stacked heterostructures are contemplated for photodetection and photocurrent generation. For example, a dual gated device can be fabricated by forming an additional top gate electrode on top of a graphene-MoS$_2$-graphene stack, using an about 60 nm of hafnium oxide (HfO$_2$) as an insulating dielectric layer and another layer of graphene as a transparent top gate electrode (FIG. 24A and FIGS. 6E,F). Another suitable dielectric material can be used in place of, or in combination with, HfO$_2$, such as zirconium oxide (ZrO$_2$), aluminum oxide (Al$_2$O$_3$), boron nitride (BN), and so forth, and another suitable transparent, electrically conductive material can be used in the transparent top gate electrode. In such an embodiment, a photocurrent generated by the device can be modulated by tuning either of, or both, a back gate voltage $V_{BG}$ and a top gate voltage $V_{TG}$, such as by tuning $V_{BG}$ within a range of −60 V to 60 V, −40 V to 40 V, −20 V to 20 V, −60 V to 0 V, −40 V to 0 V, −20 V to 0 V, 0 V to 60 V, 0 V to 40 V, or 0 V to 20 V, and by tuning $V_{TG}$ within a range of −6 V to 6 V, −4 V to 4 V, −2 V to 2 V, −6 V to 0 V, −4 V to 0 V, −2 V to 0 V, 0 V to 6 V, 0 V to 4 V, or 0 V to 2 V.

Figure 25:
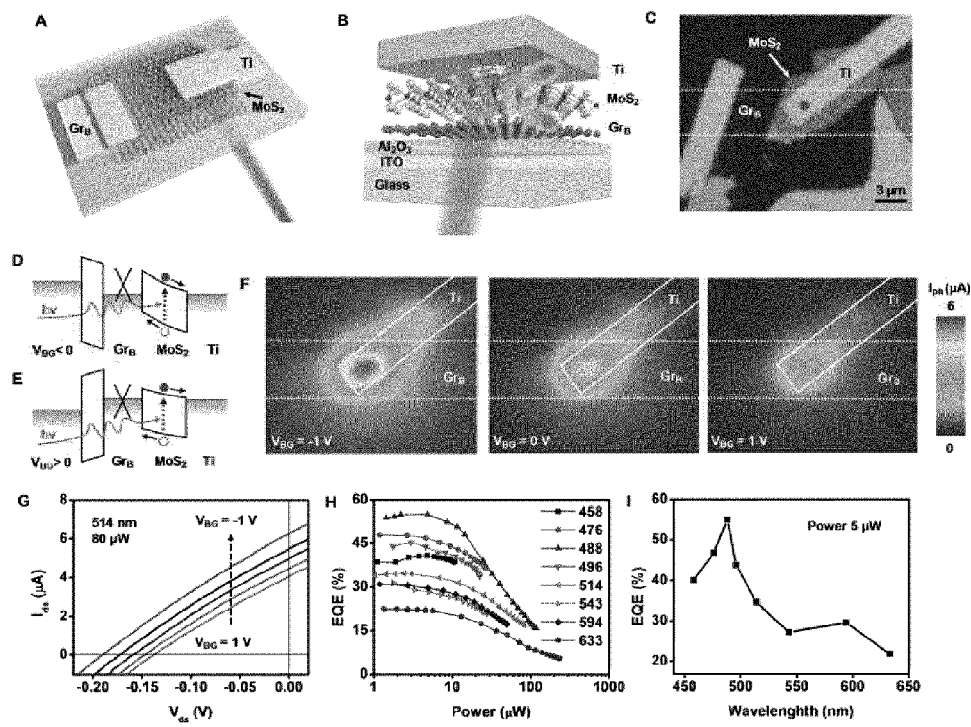
FIG. 25: (A) A schematic illustration of the three-dimensional view of a device layout. (B) A schematic illustration of the side view of the device, with a MoS$_2$ layer sandwiched between a bottom graphene electrode and a top metal electrode (Ti). The device was fabricated on a transparent ITO glass substrate (as the back gate) with 30 nm thick Al$_2$O$_3$ as the gate dielectric to allow illumination to the back side of graphene-MoS$_2$ contact. (C) Optical image of the vertical graphene-MoS$_2$-metal heterostructures. (D, E) Schematic band diagrams of the graphene-MoS$_2$-metal heterostructures at the negative and positive back-gate, respectively. (F) Scanning photocurrent images taken at V$_{BG}$ of −1, 0, and +1 V, respectively (514 nm excitation laser, 80 µN and 1 µm laser spot size). The dashed line and solid line indicate the edge of the bottom graphene and top metal electrodes, respectively. (G) I-V characteristics of the device under laser illumination (on dot in B) at variable V$_{BG}$ from −1 V to 1 V in the step of 0.5 V. (H) Excitation laser power dependence of external quantum efficiency (EQE) under various excitation wavelength at V$_{BG}$=−1 V. (I) Wavelength dependence of EQE at the laser power of 5 µW.
Figure 26:
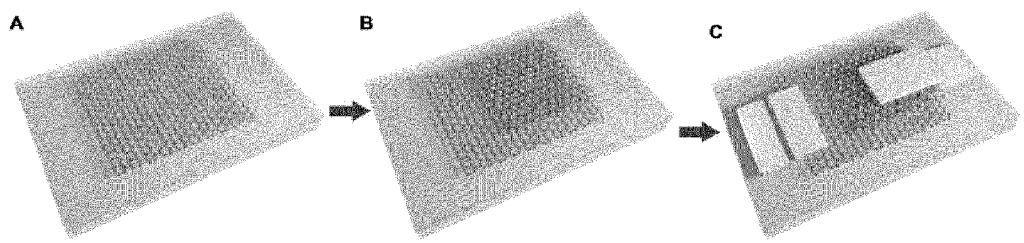
FIG. 26: (A) CVD grown monolayer graphene is transferred and patterned on an ITO glass with 30 nm Al$_2$O$_3$ dielectric layer. (B) MoS$_2$ layer is exfoliated onto the graphene through a micromechanical cleavage approach. (C) Ti/Au (50 nm/50 nm) is patterned as a top electrode and contact electrode for graphene using e-beam lithography.

Although FIG. 5 and FIG. 6 show a nearly symmetric graphene-MoS$_2$-graphene stack, other embodiments are directed to an asymmetrical vertical heterostructure of graphene-MoS$_2$-metal (e.g., Ti) for photocurrent generation. With a bottom graphene-MoS$_2$ Schottky junction and a nearly Ohmic top MoS$_2$-metal contact, the asymmetric device can allow for further enhancement of a generated photocurrent. With the opaque metal electrode on the top, the device can fabricated on a glass substrate (or other suitable transparent substrate) with about 100 nm transparent indium tin oxide (ITO) film (or other suitable transparent, electrically conductive material) as a back gate electrode and about 30 nm Al$_2$O$_3$ film as a gate dielectric (or other suitable dielectric material), to allow for excitation by laser illumination from a backside of the substrate to reach the bottom graphene-MoS$_2$ junction (FIG. 25 and FIG. 26).

Flexible Vertical Thin-Film Transistors

Flexible thin-film transistors (TFTs) are of interest for a wide range of macroelectronic applications including flexible displays, electronic paper and radio frequency identification. Conventional organic or inorganic thin film semiconductor based TFTs are often constrained by poor electrical performance or insufficient mechanical robustness. Some embodiments of this disclosure are directed to highly scalable and flexible vertical thin-film transistors (VTFTs) based on the heterostructure of graphene and amorphous indium gallium zinc oxide (α-IGZO) thin film. By using graphene as a work function tunable contact for an IGZO semiconducting channel, it is demonstrated that a vertical current flow across the graphene-IGZO junction can be effectively modulated to achieve VTFTs with a high on-off current ratio exceeding $10^5$. Of note, the VTFT architecture can readily provide transistors with ultra-short channel length (typically <100 nm as determined by a thickness of the IGZO thin film) to deliver current greatly exceeding that of planar TFTs. With large area graphene and IGZO thin film, the strategy is intrinsically scalable for large scale integration of VTFT arrays and logic circuits (e.g., inverters and NOR/NAND logic gates) on a wafer scale. Furthermore, unlike planar IGZO TFTs, in which any cracks in the IGZO channel can severely degrade a lateral charge transport, a vertical current flow in the VTFTs can be largely unaffected by any in-plane cracks, and thus can provide highly flexible macroelectronics with exceptional electrical and mechanical performance.

IGZO thin films can be prepared through a radio frequency (RF) sputtering process, and IGZO-based TFTs are of interest for applications in large area electronics (or macroelectronics). However, the performance of IGZO-based planar TFTs can be constrained by two factors of the α-IGZO material. First, the intrinsically lower carrier mobility of the α-IGZO material (about 5-20 cm$^2$/V·s) poses a constraint on an overall current density of the IGZO TFTs and consequently their switching speed. Second, although flexible plastics are desirable substrates for macroelectronic applications, the brittle nature of the ceramic IGZO film poses a constraint for its use in highly flexible electronics on plastic substrates because any in-plane cracks in the IGZO thin film can severely degrade the lateral charge transport in planar IGZO TFTs. Of note, with the design of graphene-IGZO heterostructure-based VTFTs, the ultra-short channel transistors (determined by a thickness of the IGZO thin film) can be created using a photolithography approach to provide high delivering current, and, at the same time, the vertical charge transport across the large area vertical junction makes the source-drain current largely unaffected by any in-plane cracks in the IGZO thin film. The VTFTs can therefore simultaneously address two constraints of planar inorganic (e.g., IGZO) TFTs to provide highly flexible electronics with exceptional electrical performance and mechanical robustness.

Other thin film, semiconductor materials can be used in place of, or in combination with, IGZO, such as amorphous silicon, microcrystalline silicon, cadmium selenide, lead selenide, copper indium selenide, colloidal semiconductors, and so forth. Organic, thin film, semiconducting materials are also contemplated, such as aromatic and conjugated materials including rubrene, tetracene, pentacene, diindenoperylene, perylenediimides, tetracyanoquinodimethane, and polymers such as polythiophenes (e.g., poly(3-hexylthiophene), polyfluorene, polydiacetylene, poly(2,5-thienylene vinylene), poly(p-phenylene vinylene), and so forth.

Also, integration of graphene with solution processible semiconductor materials to form vertical stacked devices can lead to solution processible, low cost, high performance transistors, photodetectors, and photovoltaic cells. Examples of solution processible semiconductor materials electrically conducting polymers, organic semiconductors, quantum dot thin films, sol-gel indium tin oxide, and so forth. Spin-coated thin film of polymers, quantum dots, or solution processible semiconductor materials can be used as a semiconducting channel layer for reliable large scale integration of vertical transistors, optoelectronics, or photovoltaic cells. The vertical transistor and optoelectronic devices can be integrated on a flexible substrate by using flexible characteristics arising from atomically thin layered structures.

Figure 7:
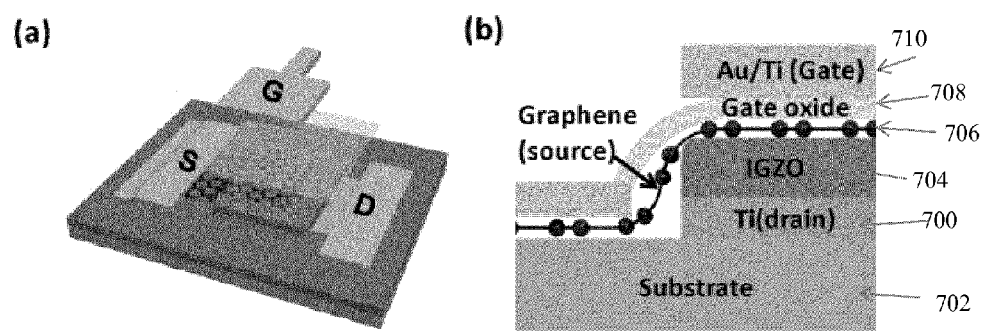
FIG. 7: Schematic illustration of a graphene-indium gallium zinc oxide (IGZO) vertical thin-film transistor (VTFT). a, A schematic of a three-dimensional perspective view of the device layout. b, A schematic of a cross-sectional view of the device, with the graphene and bottom Ti thin film functioning as source and drain electrodes, the IGZO layer as a vertically stacked semiconducting channel with its thickness defining the channel length. A 40 nm thick thin film of $Al_2O_3$ is used as a gate dielectric and Ti/Au thin film as a gate electrode.

FIG. 7 is a schematic illustration of an embodiment of a VTFT. To fabricate the vertical heterostructure device (FIGS. 7a,b), a thin film of about 60 nm thick Ti (or another metal, highly doped semiconductor, or other electrically conductive material) is first sputtered as an adhesion layer and a drain electrode 700 on a pre-patterned metal (e.g., Au) finger on a chosen substrate 702, followed by RF sputtering of α-IGZO as a semiconducting channel 704. A thickness of the semiconducting IGZO channel 704 can be at least about 20 nm, at least about 40 nm, at least about 60 nm, or at least about 80 nm, and up to about 100 nm or more, although thicknesses less than 20 nm are also contemplated. The use of the Ti layer with a low work function (about 4.33 eV) is desirable for making Ohmic contact with IGZO to ensure the delivery of a high current density by the VTFT. Next, a monolayer of graphene grown by CVD approach is transferred onto the IGZO thin film, as a source electrode 706. After photolithography and oxygen plasma etching, the graphene is patterned into about 10 μm×about 50 μm stripes. The channel area is defined by an overlapping area between the graphene layer and the IGZO/Ti thin film, which is about 10×10 μm$^2$. To ensure sufficient current flow, the overlapping area is desirably at least about 5 μm$^2$, at least about 10 μm$^2$, at least about 30 μm$^2$, at least about 50 μm$^2$, at least about 70 μm$^2$, at least about 90 μm$^2$, or at least about 100 μm$^2$, and up to about 200 μm$^2$, up to about 500 μm$^2$, or more. Next, a thin film of about 40 nm thick Al$_2$O$_3$ (or another suitable dielectric material) is deposited on top of the channel 704 as a gate dielectric 708, followed by e-beam deposition of a Ti—Au gate electrode 710. The gate electrode 710 can be formed of another metal, a highly doped semiconductor, or other electrically conductive material.

In the illustrated embodiment, a voltage source is connected to the graphene source electrode 706 to apply a source-drain voltage $V_{sd}$, a voltage source is connected to the Ti—Au gate electrode 710 to apply a top gate voltage $V_g$, and the Ti drain electrode 700 is connected to ground. During operation of the VTFT, current flows between the graphene source electrode 706 and the Ti drain electrode 700 through the semiconducting IGZO channel 704, which is modulated by the Ti—Au gate electrode 710.

Advantageously, resulting VTFTs, such as those fabricated according to FIG. 7, can exhibit a number of improved performance characteristics. For example, a VFET can have an on-current density of at least about 10 A/cm$^2$, at least about 50 A/cm$^2$, at least about 100 A/cm$^2$, at least about 200 A/cm$^2$, at least about 300 A/cm$^2$, at least about 400 A/cm$^2$, or at least about 500 A/cm$^2$, and up to 600 A/cm$^2$ or more, as measured at, for example, a source-drain voltage $V_{sd}$ of −0.1 V, −0.5 V, −1 V, −2 V, 0.1 V, 0.5 V, 1 V, or 2 V, and a gate voltage $V_g$ of 0 V, 1 V, 2 V, or 4 V. Also, the VFET can have a room temperature on-off current ratio of at least about 10, at least about 100, at least about 1,000, at least about 5,000, at least about 10,000, at least about 50,000, at least about 60,000, at least about 70,000, at least about 80,000, or at least about 90,000, and up to about 10,000 or more, as measured at, for example, a source-drain voltage $V_{sd}$ of −0.1 V, −0.5 V, −1 V, −2 V, 0.1 V, 0.5 V, 1 V, or 2 V.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Figure 8:
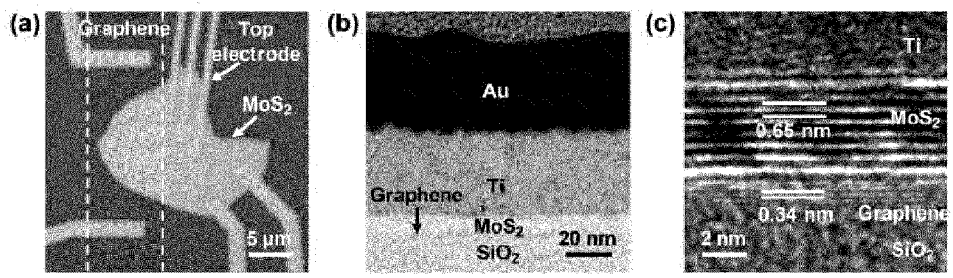
FIG. 8: Fabrication and structural characterization of a vertical transistor. a, An optical image of a typical vertical transistor device. Bottom graphene electrode is shaped to stripes of 10 µm width. Multi-layer $MoS_2$ is located on the graphene electrode, and top metal electrode is located on $MoS_2$ to overlap with bottom graphene electrode to allow vertical current flow. b, A cross-section transmission electron microscopy (TEM) image of a vertical transistor. c, A cross-section high resolution TEM (HRTEM) image of the interface between multi-layer graphene, multi-layer $MoS_2$ and top electrode of Ti. A TEM image of multilayer graphene device is shown here for better illustration because it can be difficult to visualize the monolayer graphene electrode due to electron-beam damage while conducting TEM studies.
Figure 9:
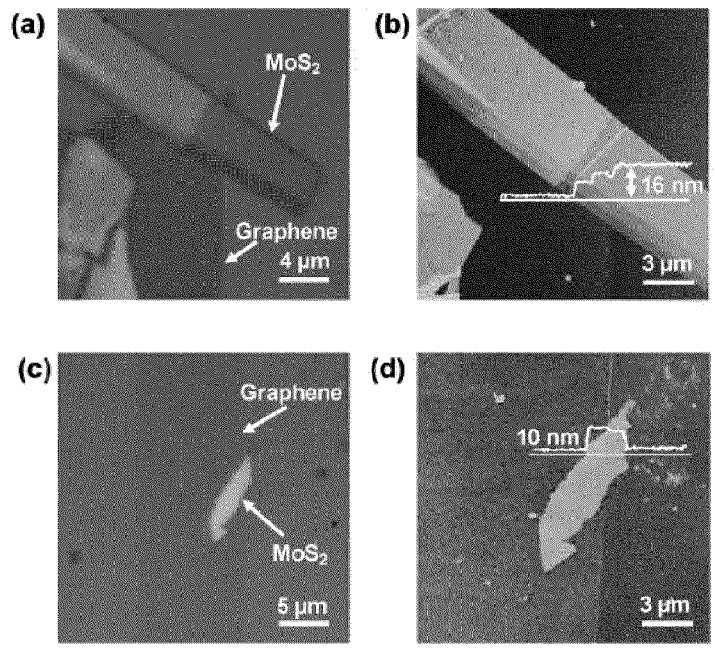
FIG. 9: a, Optical images of few layer peel-off graphene and $MoS_2$ stack and b, the corresponding AFM image. c, Optical images of $MoS_2$ on monolayer CVD graphene and d, the corresponding AFM image.

VFETs were fabricated according to the process and schematic as shown in FIG. 1 and FIG. 2. FIG. 8a shows an optical image of a typical VFET. A 10 μm strip of monolayer graphene is located inside of the dotted lines. An MoS$_2$ flake and three top metal electrodes of variable areas overlap on top of the graphene. The thickness of the MoS$_2$ flake was determined by atomic force microscope (AFM) to be 30 nm (FIG. 9). A total channel area is defined by overlapping area of graphene and top metal electrode. Two separate pairs of electrodes were formed on graphene and MoS$_2$ in the non-overlapping region to characterize the planar electrical performance. Cross-sectional transmission electron microscopy (TEM) was used to characterize the overall integration of graphene-MoS$_2$-top electrode vertical stack. The complete stack of SiO$_2$/graphene/MoS$_2$/Ti/Au could be readily seen in the low magnification cross-section TEM image (FIG. 8b). A high-resolution TEM image of the SiO$_2$/graphene/MoS$_2$/Ti interface shows that the graphene layers are intimately integrated with the MoS$_2$ layers without any noticeable gap or impurities between them (FIG. 8c). The layer spacings are 0.65 nm and 0.34 nm in MoS$_2$ layer and graphene layer, respectively. A TEM image of a multilayer graphene device is shown here because of the difficulties in visualizing monolayer graphene device due to electron-beam damage while conducting TEM studies. Together, these studies demonstrate that the physical assembly approach can effectively integrate layered graphene and MoS$_2$ to form intimate contact.

Figure 10:
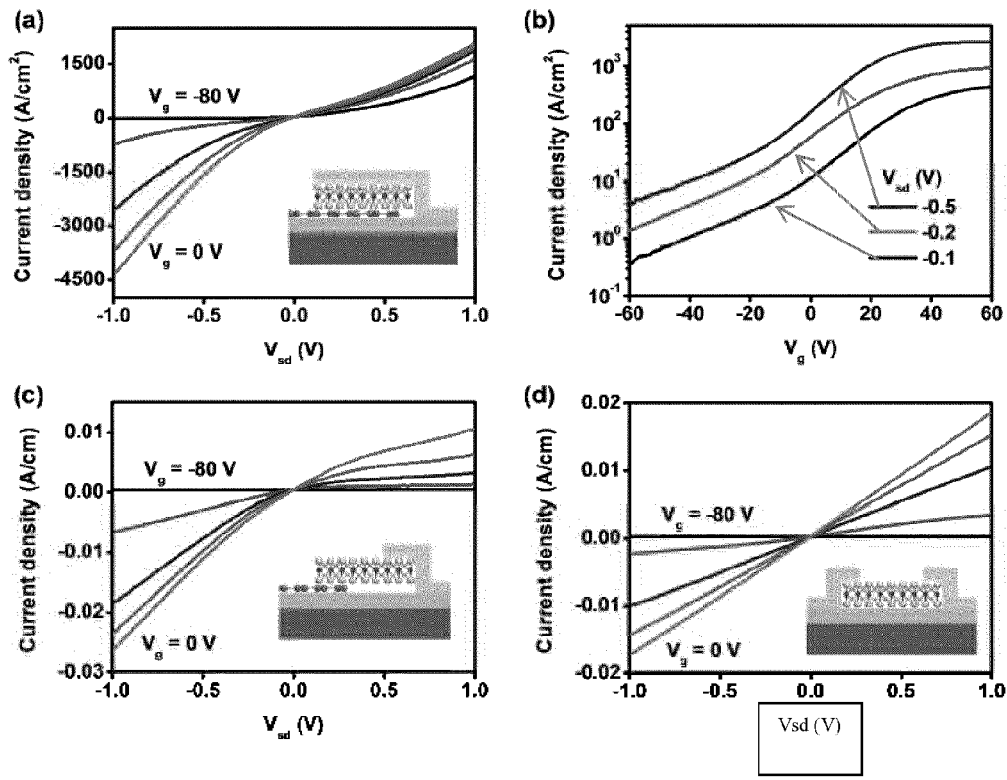
FIG. 10: Room temperature electrical properties of vertical and planar transistors. a, $I_{sd}$-$V_{sd}$ output characteristics of a vertical transistor. The current is normalized by the area. b, $I_{sd}$-$V_g$ transfer characteristics of the device shown in a at $V_{sd}$=−0.1, −0.2, and −0.5 V. c, $I_{sd}$-$V_{sd}$ output characteristics of a planar transistor with $MoS_2$ channel between a graphene electrode and metal electrode. d, $I_{ds}$-$V_{sd}$ output characteristics of a planar transistor with two top metal electrodes and planar $MoS_2$ channel. The current is normalized by the width of the electrode in c, d. The back-gate voltage is varied from −80 V to 0 V in steps of 20 V in a, c, d. Insets in a, c, d shows schematics of the transistor structure for each output characteristics
Figure 11:
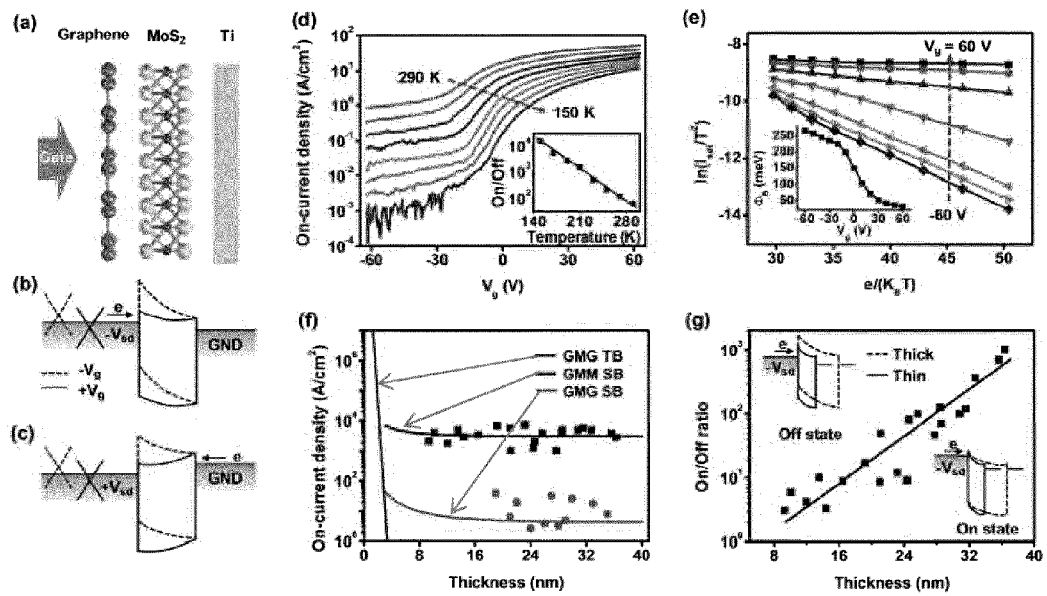
FIG. 11: Schematic illustration of the band diagrams of vertical transistors and their electrical characteristics. a, The schematics of a vertical transistor. Gate electric field is applied from silicon back gate located at the bottom of graphene and grounded top electrode. b, c, The band structure at negative source bias at graphene (b, $V_{sd}$<0) and positive source bias at graphene (c, $V_{sd}$>0) under positive (solid) or negative (dashed) $V_g$. d, Transfer characteristics of a VFET at different temperatures from 290 K to 150 K. Inset shows corresponding on-off ratio variation. e, Temperature dependent diode characteristic. Each curve from bottom to top was obtained at different $V_g$ from −60 V to 60 V with 20 V step variation. Inset shows corresponding Schottky barrier height variation obtained from the slope of the fitted line. f, Simulated on-current density of graphene-$MoS_2$-graphene tunneling barrier (GMG TB), graphene-$MoS_2$-Metal(Ti) Schottky barrier (GMM SB), and graphene-$MoS_2$-graphene Schottky barrier (GMG SB) at bias of −0.1 V. Experimental on-current density are plotted by square (■) for GMM SB and circle (●) for GMG SB at $V_{sd}$=−0.5 V. g, The on-off current ratio of vertical transistors with various channel length (thickness of $MoS_2$). On and off state band diagrams for thin (solid) and thick (dashed) $MoS_2$ layers are represented in the insets.

Electrical transport studies of the vertical transistors and planar transistors were carried out in ambient condition at room temperature. First, measurements were performed on the output characteristics of the vertical transistor (FIG. 10a). The vertical transistor in this study has 36 nm of channel length (MoS$_2$ thickness) as determined by AFM measurement. The current was normalized by an overlapping area of graphene and top metal electrode to obtain current density. The output characteristics at various back gate voltages show that the current density decreases with increasing negative gate potential, demonstrating that electrons are the majority charge carriers in this vertical transistor, which is consistent with the n-type semiconducting characteristics observed in MoS$_2$ materials. In the negative source-drain voltage ($V_{sd}$) regime, clear on and off current modulation can be achieved with the gate bias modulation. On the other hand, in the positive $V_{sd}$ regime, a much smaller gate modulation is observed. This difference can be attributed the asymmetrical contact at source and drain end, and will be further discussed in FIG. 11.

Figure 12:
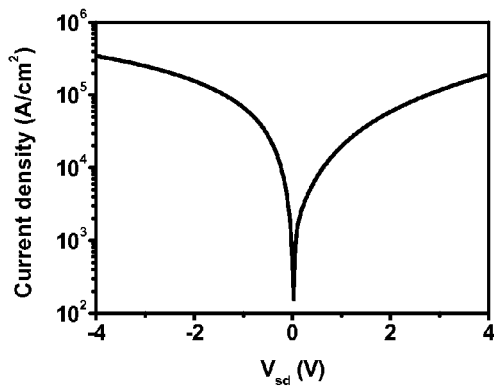
FIG. 12: Maximum current density in a VFET with a 15-nm thick $MoS_2$ layer can readily exceed 350,000 A/$cm^2$ at 4 V of bias.

FIG. 10b shows the transfer characteristics ($I_{sd}$-$V_g$ curves) for the same device at $V_{sd}$=−0.1, −0.2 and −0.5 V. Overall, the device shows a room temperature on-off current ratio of about 1,500 at all $V_{sd}$ values, which is about 1-2 orders of magnitude better than typical graphene devices at room temperature, and is already sufficient for typical logic device applications. The device delivers a large on-current density of 2,600 A/cm$^2$ at $V_{sd}$=−0.5 V and $V_g$=60 V. In general, the maximum on-current density in an optimized VFET device can readily exceed 5,000 A/cm$^2$ at $V_{sd}$=−1.0 V. It is noted that this current density is about 3-5 orders of magnitude larger than values reported for vertical tunneling transistors and barristor at the same source-drain bias. With the current VFET structure, a high current density and a high on-off ratio are simultaneously achieved for the first time, which is desirable for high performance logic transistors. Furthermore, the maximum on-current density in the VFET device can readily exceed 350,000 A/cm$^2$ at $V_{sd}$=−4 V without consideration of on-off ratio, which is 2 orders of magnitude larger than the reported maximum current density of a barristor (FIG. 12).

Figure 13:
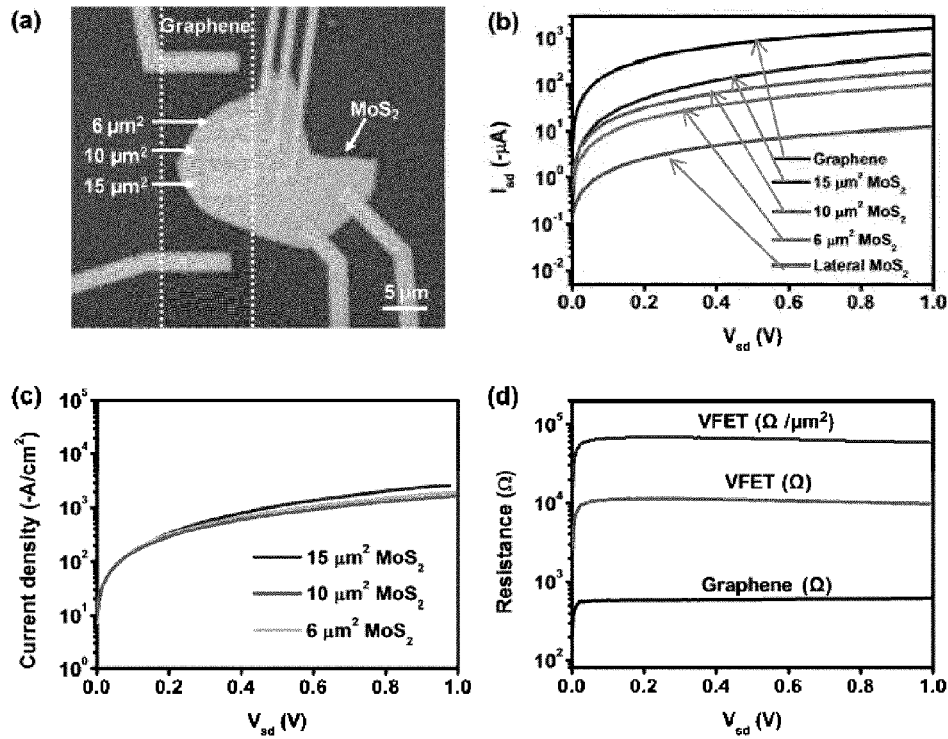
FIG. 13: a, Optical image of vertical transistors with three different top electrode areas. b, Characteristic $I_{sd}$-$V_{sd}$ curves for vertical transistors at $V_g$=80 V with three different top gate areas and planar transistor of graphene and $MoS_2$ without normalization by area. c, Normalized current density of vertical transistors with three different top gate areas. d, Contact resistance of VFET. A 15 µ$m^2$ VFET shows a resistance of $10^4 \Omega$, which is composed of metal-graphene contact resistance, graphene strip resistance, graphene-$MoS_2$ contact resistance, $MoS_2$ channel resistance, and $MoS_2$-Metal contact resistance. The resistance of 37 nm $MoS_2$ channel and Ohmic $MoS_2$—Ti contact resistance are negligible. The resistance of graphene strip (12 µm width and 28 µm length) with two metal contact was about $6 \times 10^2 \Omega$, about 6% of total VFET resistance, roughly half of which can contribute to the overall resistance of the VFET device. As a result, the overall resistance of the VFET is dictated by the resistance of graphene-$MoS_2$ contact (at least 97%). The calculated graphene-$MoS_2$ contact resistance in 1×1 µ$m^2$ is about $6 \times 10^4$ $\Omega$/µ$m^2$ at the on-state ($V_g$=80 V).

To further confirm the vertical charge transport in the VFETs, electrical characteristics of planar transistors with few-layer MoS$_2$ as the planar channel are characterized as a control. FIG. 10c shows the output characteristics of a planar transistor with non-overlapping bottom graphene and top metal source-drain electrodes, and FIG. 10d shows the output characteristics of planar transistors between two top metal source-drain electrodes, as shown schematically in the insets of the respective Figures. In these output characteristics, the current is normalized by the channel width. Although it is not necessarily precise to compare area current density versus line current density, it is noted that the actual current of the VFETs is at least more than 20 times larger than those of planar transistors with similar dimension. This striking difference in current amplitude between the vertical and planar devices confirms the charge transport in the vertical direction indeed dominates the vertical stacked devices. Additionally, studies on vertical devices with variable area in the range of 6-15 μm$^2$ result in comparable normalized area current densities (FIG. 13), further demonstrating the vertical charge transport is the dominant mechanism for the current flow in the vertical devices.

FIG. 10a shows that the vertical transistor exhibits directionally dependent current flow and asymmetrical gate modulation, in which the output characteristics of the VFET were different under negative and positive source-drain biases. Under negative $V_{sd}$, the device has a large gate modulation exceeding 3 orders of magnitude, whereas under positive $V_{sd}$, the device shows a much smaller gate modulation. These results can be explained by using the band diagrams shown in FIGS. 11b and c, depicting the cases of negative and positive $V_{sd}$, respectively. The gate electric field is applied between silicon back gate and grounded top metal electrode. The graphene-MoS$_2$ barrier height and the MoS$_2$ Fermi level can be effectively modulated near the graphene-MoS$_2$ contact because of limited density of states and weak electrostatic screening effect of graphene (FIG. 11b). In contrast, the MoS$_2$ Fermi level near the MoS$_2$-metal contact is effectively pinned, and can barely be modulated by the gate due to strong screening effect of the top-metal electrodes (FIG. 11c). As a result, an asymmetric gate modulation is expected between positive and negative $V_{sd}$.

The application of a negative $V_{sd}$ across the device makes electrons flow from graphene to the top electrode. In this case, the Schottky barrier at the contact between graphene-MoS$_2$ plays a dominant role in current modulation (FIG. 11b). A positive gate voltage effectively reduces the graphene-MoS$_2$ Schottky barrier height as well as the depletion width in MoS$_2$ layer, allowing electrons to readily overcome the Schottky barrier via thermionic emission or thermionic field emission processes, and therefore enhances the charge transport characteristics of the vertical device. In contrast, a negative gate voltage increases the Schottky barrier height and depletion width and suppresses the electron transport across the vertical stack. In this way, the device essentially operates as an n-type field-effect transistor in the negative $V_{sd}$ regime where the application of the gate voltage can effectively modulate the charge transport across the MoS$_2$ layer to result in a large on-off ratio in the vertical device. On the other hand, under positive $V_{sd}$ conditions across the device, electrons are injected into MoS$_2$ through the top-metal electrode and rolls downhill in MoS$_2$ to the bottom graphene electrode. Therefore, the top metal-MoS$_2$ contact plays the primary role in determining the current modulation (FIG. 11c). With the electrostatic screening of the top metal electrode, the weak gate modulation on the barrier at the top electrode-MoS$_2$ contact thus leads to a much smaller on-off ratio.

Figure 14:
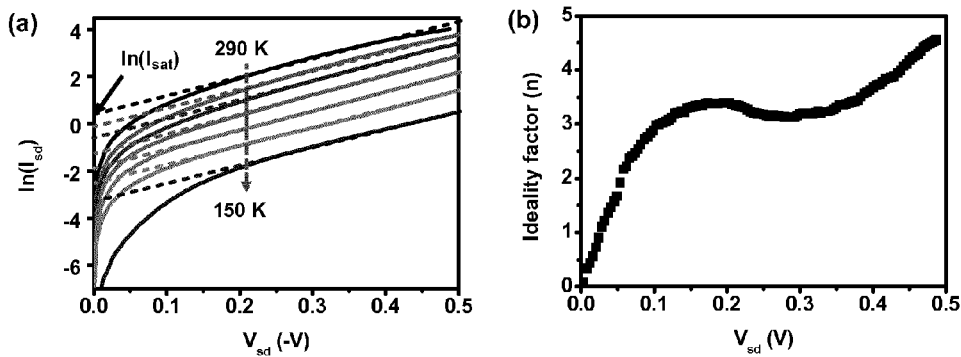
FIG. 14: a, Output characteristics of a VFET at different temperatures from 290 K to 150 K. Each curve was measured at $V_g$=60 V. b, The ideality factors of graphene-$MoS_2$-metal (GMM) VFET at $V_g$=0 V and temperature of 290 K determined from a plot of the logarithm of the forward-bias current.

To further probe the charge transport through graphene-MoS$_2$-metal VFETs, temperature dependent studies are performed. A family of $I_{sd}$-$V_g$ plots ($V_{sd}$=−0.1 V) obtained at different temperature demonstrates that the on-current exhibits relatively small temperature dependence while the off-current decreases exponentially with decreasing temperature, with the on-off ratio increased from 60 at 290 K to 15000 at 150 K (FIG. 11d). The variable temperature transport measurements allow the determination of the Schottky barrier heights across the graphene-MoS$_2$ junction. According to the thermionic emission theory, the diode saturation current is related to the Schottky barrier height by the following equation:

$$I_{sat} = AA^*T^2 \exp\left(-\frac{q\varphi_B}{k_B T}\right)$$

where A is the area of the Schottky junction, $A^* = 4\pi q m^* k_B^2 h^{-3}$ is the effective Richardson constant, q is the elementary charge, $k_B$ is the Boltzmann constant, T is the temperature, m* is effective mass, and h is plank constant. The saturation current was determined from a plot of the logarithmic of the forward-bias current (FIG. 14). The ideality factor of the graphene-MoS$_2$ diode can also be determined from this plot to be 3-4.5. The deviation from an ideal diode may be attributed to graphene-MoS$_2$ interface defects and also likely the electrostatic screening effect of top MoS$_2$-metal contact due to the very small MoS$_2$ channel thickness (length). Based on the relation in the above equation, the Schottky barrier height can then be estimated from the slope of the $\ln(I_{sat}/T^2)$ vs. $q/k_B T$ plots (FIG. 11e). The derived Schottky barrier shows a clear dependence on the gate voltage ($V_g$): changing from 260 meV to 33 meV as the $V_g$ is increased from −60 V to 60 V. This change in Schottky barrier height can be largely attributed to modulation of graphene work function. It is noted that the Schottky barrier height is largely unchanged in large negative and large positive gate voltage when Fermi level ($E_F$) of graphene is located far from Dirac point because of relatively high density of states at this point. However, the Schottky barrier height is dramatically changed near 0 V gate bias when $E_F$ is located near the Dirac point in graphene because of a much lower density of states.

The Schottky barrier height at $V_g=0$ V is 150 meV, which is much smaller than the 400 meV value as expected from the energy level difference between the work function of graphene (4.5 eV) and the electron affinity of $MoS_2$ (about 4.1 eV). This difference may be attributed to electrostatic screening effect of top metal electrode that could effectively reduce the bottom Schottky barrier height (and width) due to the ultra-short channel length (about 20 nm).

It is noted that a VFET is quite different from vertical tunneling transistors in that the $MoS_2$ layer in the VFET device functions as a true semiconducting channel instead of an insulating tunneling barrier, which achieves a much larger vertical current flow while retaining a high on-off ratio. In general, the device exhibits a unipolar behavior with electrons as the majority carriers (dictated by n-type $MoS_2$ layer) instead of bipolar characteristics in vertical tunneling transistors with the carrier type determined by the gate modulated graphene. To further understand the difference between VFETs and vertical tunneling transistors, three different device configurations are considered, including graphene-$MoS_2$-graphene tunneling barrier (GMG TB) (FIG. 15a), graphene-$MoS_2$-graphene Schottky barrier (GMG SB) (FIG. 15b), and graphene-$MoS_2$-metal (Ti) Schottky barrier (GMM SB) (FIG. 15c) with variable $MoS_2$ thickness, and the corresponding current density is calculated for each configuration.

Figure 15:
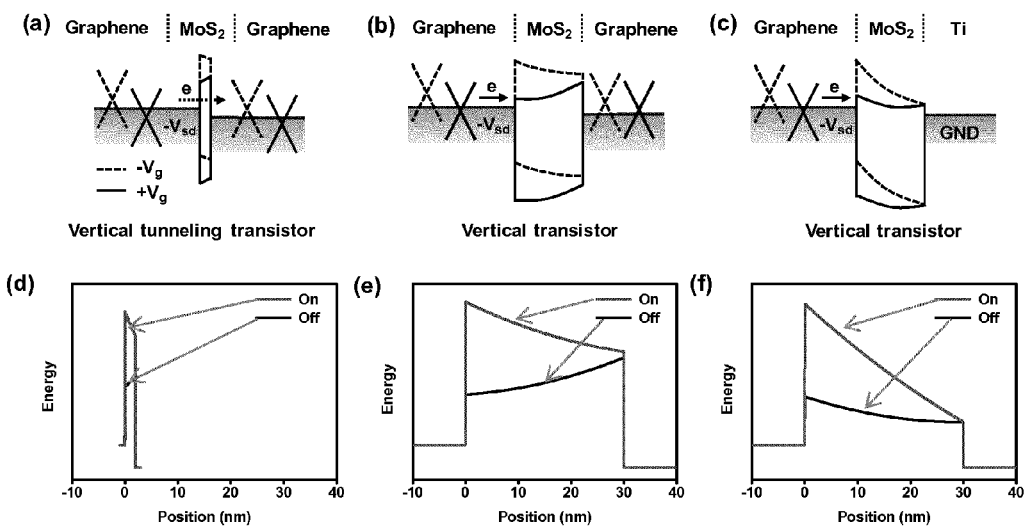
FIG. 15: a, Band diagram of a vertical tunneling transistor for graphene-$MoS_2$-graphene stack. b, Band diagram of a VFET for graphene-$MoS_2$-graphene stack. c, Band diagram of a VFET for graphene-$MoS_2$—Ti stack. d, e, and f, The corresponding simulated energy band diagrams for a, b, and c respectively. In the graphene-$MoS_2$-graphene stack with very thin $MoS_2$ layer (<4 nm), the tunneling current is dominant in charge transport (FIG. 14a). In the graphene-$MoS_2$-graphene stack with thick $MoS_2$ layer, the Schottky barrier at the top $MoS_2$-graphene contact is weakly modulated by gate bias because of screening effect from thick MoS$_2$ layer. In the graphene-MoS$_2$—Ti stack, this Fermi level of MoS$_2$ is pinned by the low work function metal (Ti) to have a nearly Ohmic contact.
Figure 16:
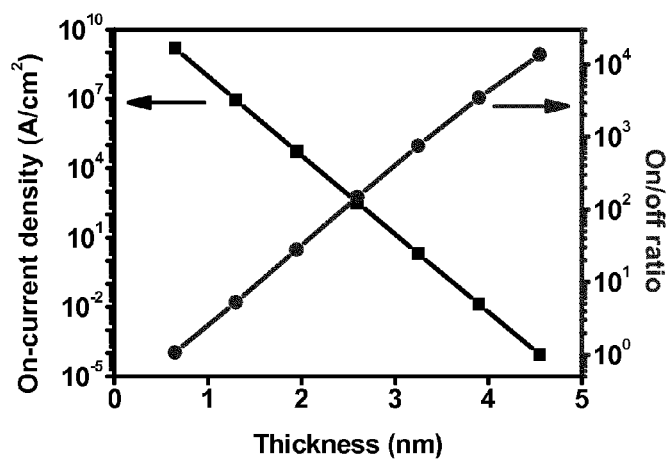
FIG. 16: Calculated on-current density and on/off ratio of graphene-MoS$_2$-graphene (GMG) vertical tunneling transistor. In vertical tunneling transistor of graphene-MoS$_2$-graphene stack, high current density (>10$^1$ A/cm$^2$) can be achieved by using 1-4 layers of MoS$_2$ tunneling barrier but typically with rather weak gate modulation (<10$^2$). With thicker MoS$_2$ (5-7 layers), the on-off ratio can be improved, but the on-current is limited (<10$^0$ A/cm$^2$)
Figure 27:
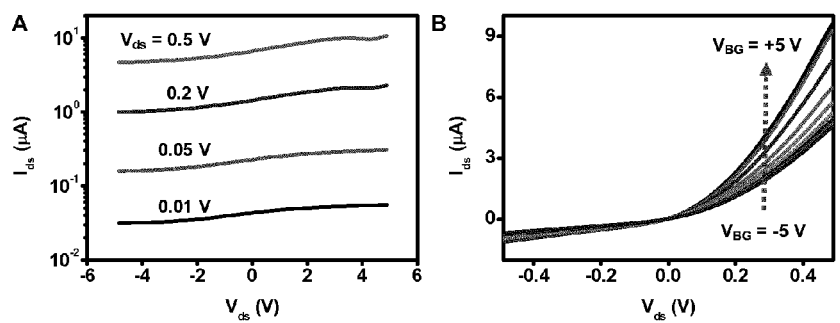
FIG. 27: (A) Transfer characteristics of a graphene-MoS$_2$-metal vertical heterostructure on ITO/Al$_2$O$_3$ (30 nm) substrate at V$_{sd}$=0.01 V, 0.05 V, 0.2 V and 0.5 V. (B) Output characteristics of the same device. The back gate voltage is varied from −5 V (bottom) to 5 V (top) in the step of 1 V.

For the GMG stack with very thin $MoS_2$ layer (<4 nm), the Fermi level in $MoS_2$ are effectively pinned by both the bottom and top junctions and can barely be modulated by the back gate (FIG. 15a). The tunneling current is the dominant component in charge transport (FIGS. 11f, 27). The calculation shows that a rather large on-off current ratio can be achieved by using 5-7 layers (about 2.5-4 nm) $MoS_2$ tunneling barrier, but with relatively small current density (<1 $A/cm^2$) (FIG. 16). For even thicker $MoS_2$ layers (>4 nm), the thermionic emission through Schottky barrier becomes the dominant component in charge transport. The calculated thermionic emission current shows a rather weak dependence on the $MoS_2$ thickness in the range of 4-40 nm, likely due to a substantially complete depletion of the semiconductor layer and downhill charge transport after crossing the barrier. It is noted that there is substantial difference between GMM (Ti) SB and GMG SB devices, where the calculated current density of GMM (Ti) SB (FIG. 11f) is about 3 orders of magnitude larger than that of GMG SB configuration (FIG. 11f).

Figure 17:
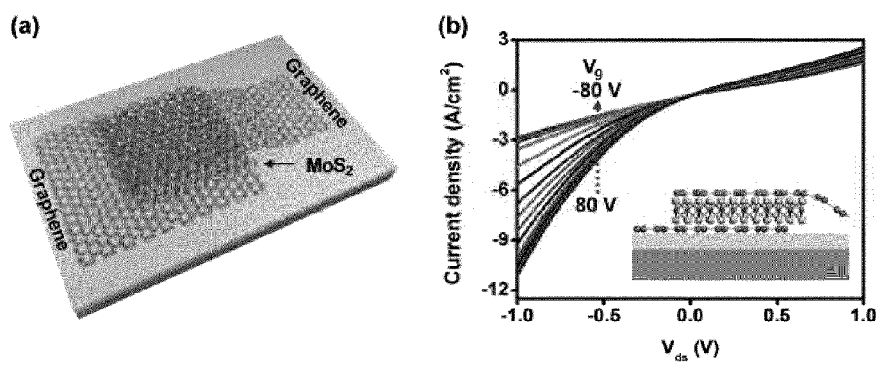
FIG. 17: a, Schematic image of a GMG stack VFET. b, Output characteristics of the GMG VFET. The thickness of MoS2 is about 30 nm. The current is normalized by overlapped graphene area. The back-gate voltage was varied from −80 V to 80 V in the step of 10 V. Inset shows schematic of side view of the GMG vertical transistor.

Studies were performed to experimentally investigate a large number of GMM (Ti) SB devices with variable $MoS_2$ thickness and device sizes. The overall on-current density is typically in the range of $10^3$~$10^4$ $A/cm^2$ with a weak dependence on the $MoS_2$ layer thickness (square symbols in FIG. 11f), matching well with calculated current density. Studies on GMG SB devices with variable $MoS_2$ thickness have also be done as a control experiment (FIG. 17). The obtained on-current in GMG SB devices (dot symbols in FIG. 11f) is about 2-3 orders magnitude smaller than that of GMM(Ti) SB devices, consistent with theoretical calculations. This consistent difference observed in theoretical modeling as well as experimental studies demonstrate the GMM SB device as quite different from the GMG SB structure. In the GMG SB with thick $MoS_2$ layer, two Schottky barriers are formed at both $MoS_2$-graphene contacts with the bottom-one strongly modulated and top-one weakly modulated by the back-gate in the opposite direction (FIG. 15b). Even though the electrons can be effectively injected through the bottom barrier at on-state, the top Schottky barrier can suppress the overall current flow to result in a lower current density. In contrast, for the GMM SB configuration, the top Schottky barrier height is minimized and can hardly be modulated by using a low work function metal (Ti) to make a nearly Ohmic contact with $MoS_2$ (FIG. 15c). In this way, the charge transport is dominated by the bottom graphene-$MoS_2$ Schottky barrier height and width, which can be effectively modulated by the back-gate voltage to allow for highly efficient injection and transportation of the electrons through the $MoS_2$ layer, allowing a very large current density that is about 3 orders of magnitude larger than that of the GMG TB or GMG SB devices with similar on-off ratios. Additionally, comparing barristors with bulk silicon as the semiconductor layer to the GMM SB device, the charge transport through thick bulk silicon (>>10 μm Si) and the thick depletion layer at graphene-Si junction can severely limit the overall current flow to result in a current density that is also about 2-3 orders of magnitude smaller than the GMM SB VFETs.

FIG. 11g shows the room temperature on-off current ratios of the VFETs. The on-off ratios are strongly dependent on the $MoS_2$ thickness. In general, it is found that the room temperature on-off ratio of the vertical transistors can exceed 3 orders of magnitude with relatively thick $MoS_2$ layer (e.g., 30-40 nm), and gradually decreases to 3 when the $MoS_2$ thickness is reduced to 9 nm or so. This trend can be explained by a short channel effect. With decreasing $MoS_2$ thickness, the potential of entire channel (including graphene-$MoS_2$ contact) is becoming more and more dominated by the electric field of top metal electrodes, which can reduce the bottom off-state Schottky barrier height and width to result in a smaller on-off ratio (FIG. 11g insets). The room temperature on-off ratio of $>10^3$ achieved in the devices can be further improved by reducing interface defects at the graphene-$MoS_2$ interface, and also can be improved to $>10^4$ upon cooling (as demonstrated by low temperature studies, see FIG. 11d).

Figure 18:
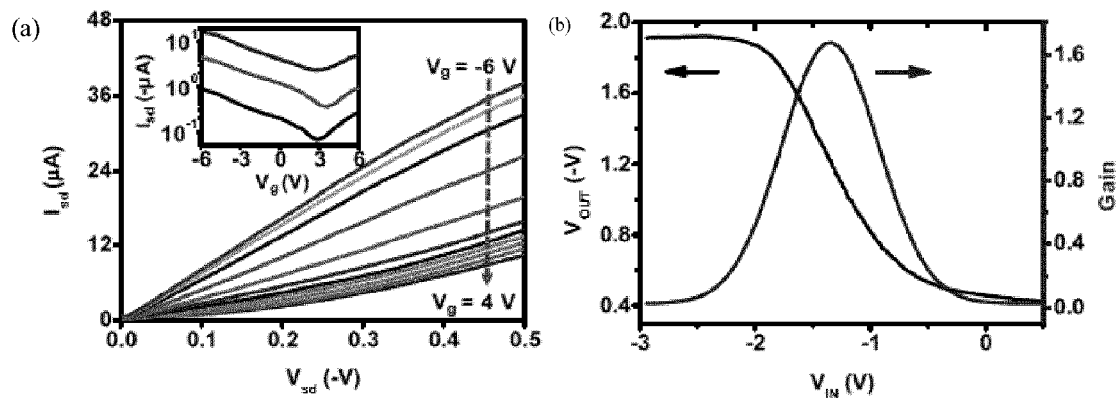
FIG. 18: Vertically stacked multi-heterostructures of layered materials for complementary inverters. a, Output characteristics of a p-channel Bi$_2$Sr$_2$Co$_2$O$_8$ VFET with top and bottom graphene electrodes on Si/SiN$_x$ (20 nm) substrate. The back gate voltage is varied from −6 V (top) to 4 V in the step of 1 V. Inset is the transfer characteristics of Bi$_2$Sr$_2$CO$_2$O$_8$ VFET at V$_{sd}$=−0.2, −0.05, and −0.01 V from top to bottom. b, Inverter characteristics from vertically stacked p- and n-type VFETs. A negative supply voltage (V$_{DD}$=−2 V) is applied to bottom graphene, and the gain of the inverter is about 1.7.
Figure 20:
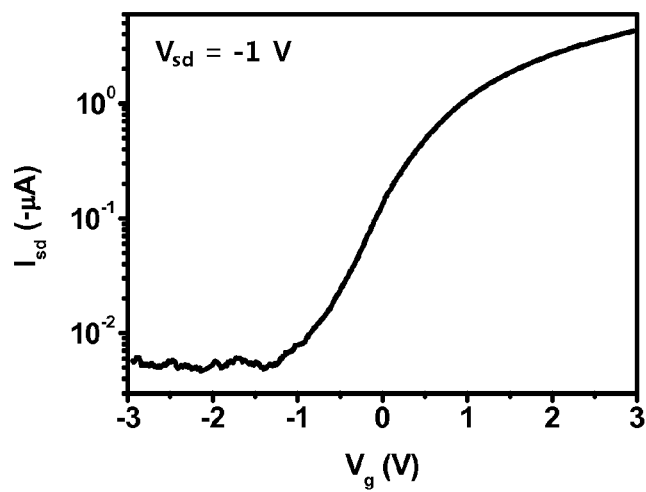
FIG. 20: Transfer characteristics of a top stack of n-channel MoS$_2$ VFET in a vertically stacked multi-heterostructure inverter (V$_{sd}$=−1 V). The top stack of n-channel MoS$_2$ VFET retains excellent switching characteristics, demonstrating a bottom gate electrical field can readily penetrate through a thin bottom p-channel device to effectively modulating the top re-channel VFET.

This strategy of vertical integration is general and can be readily extended various layered materials to obtain vertically stacked devices with both n- and p-channel characteristics. To this end, a complementary inverter is demonstrated according to FIG. 3 and FIG. 4, by vertically stacking multi-heterostructures of layered materials including graphene, BSCO (p-channel) (FIG. 19), graphene, $MoS_2$ (n-channel), and metal thin film on $Si/SiN_x$ (20 nm) substrate. Electrical measurement shows the vertically stacked BSCO layer with both bottom- and top-graphene contacts exhibits p-channel characteristics (FIG. 18a). More importantly, the top stack of n-channel $MoS_2$ VFET retains excellent switching characteristics (FIG. 20), demonstrating the bottom-gate electrical field can readily penetrate through the thin bottom thin p-channel device to effectively modulating the top n-channel VFET. In this way, the vertically stacked multi-heterostructures effectively forms a complementary inverter with a larger than unit voltage gain (1.7) (FIG. 18b).

In conclusion, this example demonstrates that vertical integration of heterostructures of layered materials can provide a new design of graphene based transistors with both high on-off current ratio and high current density at room temperature for high performance logic applications. With the use of ultrathin layered semiconducting channel and the Ohmic contacted top metal-electrode, the VFETs can deliver an unprecedented current density that is 2-5 orders magnitude larger than that of graphene based vertical tunneling transistors and barristors, while retaining a room temperature on-off current ratio exceeding 3 orders of magnitude. It should be noted that the achievement of high current density is central to the performance of a transistor since the intrinsic delay of a transistor ($\tau=CV/I$) is inversely proportional to the deliverable current density. With similar device geometry, higher current at the same bias can be directly translated into higher device speed. Taking a step further, this example also demonstrates that the vertical integration of multi-heterostructures of layered materials can be used to effectively create more complicated device functions including a complementary inverter with more than unit voltage gain, demonstrating the feasibility to implement vertically stacked devices for logic applications with gain. This is quite different from logic functions achieved from the lateral integration of p- and n-type barristors, which are largely similar to conventional planar electronics. A striking point that is demonstrated here is the electrical field can readily penetrate through a first layer of p-FET and effectively modulate a second layer n-FET, making the vertical integration of multi-heterostructures possible for functional devices. This example demonstrates a general strategy to integrate layered materials in the vertical direction to provide functional devices and circuits, and can open up a new dimension for high density integration of function devices in the limited circuit area.

Methods

Synthesis and Characterization.

Graphene was grown by chemical vapor deposition on copper foil at 1050° C. with methane as a carbon-containing precursor. After growth, the graphene was transferred onto silicon/silicon oxide substrate and patterned into 50 μm by 10 μm strips by oxygen plasma etching. The molybdenum disulfide flakes ($MoS_2$) were then exfoliated onto the graphene strips through a micromechanical cleavage approach. The top metal electrode was patterned on the $MoS_2$ to overlap with graphene by e-beam lithography and e-beam deposition of Ti/Au (50/50 nm).

Microscopic and Electrical Characterization.

The sample was characterized by a TF20 TEM unit operating at 300 kV. Tapping-mode AFM was carried out with a Veeco 5000 system. SEM imaging was performed on a JEOL 6700F unit operated at 5 kV. The D.C. electrical transport studies were conducted with a probe station at room temperature (25° C.) under ambient conditions with a computer-controlled analog-to-digital converter.

Ideality Factor in VFET.

The ideality factors of graphene-$MoS_2$-metal (GMM) VFET at $V_g=0$ V and temperature of 290 K were determined from a plot of the logarithm of the forward-bias current based on the following equation:

$$I = I_{sat}\left(\exp\left(\frac{qV}{nk_BT}\right) - 1\right)$$

where I is the current through the diode, V is the voltage across the diode, $I_{sat}$ is the dark saturation current, n is the ideality factor, and T is the temperature in Kelvin. q and $k_B$ are both constant. For V>100 mV, the −1 term can be ignored and so the above equation is reduced to $$I = I_{sat}\exp\left(\frac{qV}{nk_BT}\right)$$

Taking the logarithm of both sides of the equation gives $$\ln(I) = \ln(I_{sat}) + \left(\frac{q}{nk_BT}\right)V$$

When plotting the natural logarithm of the current against the voltage, the slope gives $q/nk_BT$, and the intercept gives $\ln(I_{sat})$. The ideality factor is typically in the range of 3-4.5 in $V_{sd}$=0.1 V~0.5 V. The deviation from an ideal diode may be attributed to graphene-$MoS_2$ interface defects and also likely electrostatic screening effect of top $MoS_2$-metal contact due to the very small $MoS_2$ channel thickness (length).

Calculation of VFET to Find Charge Distribution.

The configurations of GMG and GMM are considered using simulation. A similar model is used as described in Britnell, L. et al. "Field-effect tunneling transistor based on vertical graphene heterostructure," Science 335, 947-950 (2012). However, in the current case, $MoS_2$ is a semiconductor instead of insulator. The depletion approximation is adapted, which means $MoS_2$ is uniformly charged, and the charge density equals its doping level. Therefore, bands of $MoS_2$ are parabolic instead of linear. This model is reasonable when the device channel is short, as in the current case.

For the simulation of GMG, the electric field is induced by the gate as $E_g$ as follows:

$$E_g=V_g/D$$

where $V_g$ is the gate voltage, and D is the thickness of $SiO_2$ dielectric.

Electric fields in the two graphene-$MoS_2$ interfaces are considered as $E_1$ and $E_2$. The carrier density $n_1$ and $n_2$ for bottom graphene and top graphene, respectively, can be given by:

$$\in_1 E_g + \in_s E_1 = n_1 e$$

$$\in_s E_2 = n_2 e$$

where $\in_1$ and $\in_2$ are the dielectric constant for $SiO_2$ and $MoS_2$, respectively.

$E_1$ and $E_2$ satisfy:

$$E_1 = E_2 + \frac{Ned}{\varepsilon_s}$$

where N is the doping level in $MoS_2$. In the simulation, N is chosen to be $10^{17}$ cm$^{-3}$, which can be roughly estimated from transport characteristics of $MoS_2$ used in the study.

Given $E_1$ and $E_2$, the potential drop $\Delta V$ in $MoS_2$ can expressed as:

$$\Delta V = \tfrac{1}{2}(E_1+E_2)d$$

For graphene, the relation between carrier density n and chemical potential μ (Dirac point as zero) can be expressed as:

$$\mu = \frac{h}{2\pi}v_F\sqrt{\pi|n-n_0|}$$

where h is the plank constant, $v_F$ is the Fermi velocity, and $n_0$ is the fixed charge graphene. Intrinsic graphene in air is p-doped, and the fixed charge can derive from $SiO_2$ substrate or absorbing $H_2O$ and $O_2$ molecular.

When a bias voltage $V_b$ is applied, the effect is:

$$eV_b=e\Delta V+\mu_2-\mu_1$$

For GMM, the effect can be different because the bands of $MoS_2$ are pinned in the metal side. The above equation should be replaced by:

$$eV_b=e\Delta V-\mu_1+W_g-W_m$$

where $W_g$ is the potential drop from the vacuum level to Dirac point of graphene, and $W_m$ is the work function of metal. Another difference is that $n_2$ should be the charge density in the interface of $MoS_2$ and metal. The equations above are solved self-consistently for both cases.

Calculation of Device Performance.

Two effects can contribute to the current transport in the device: thermal emission and tunneling.

For thermal emission, the Schottky diode equation can be expressed as:

$$J = A * T^2 \exp\left(-\frac{\varphi_b}{k_B T}\right)\left(\exp\left(\frac{eV_b}{k_B T}\right) - 1\right)$$

where J is the current density, A* is the effective Richardson constant, T is the temperature, $k_B$ is the Boltzmann constant, and $\varphi_b$ is the Schottky barrier height.

The equation includes two parts: the first part is the thermal emission from semiconductor to metal, and the second part is from metal to semiconductor. Here, it is assumed that $MoS_2$ is depleted and, thus, for GMM, the first part should be replaced by thermal emission from metal to graphene, and the second part should be from graphene to metal. For GMG configuration, the first part should be replaced by thermal emission from top graphene to bottom graphene, and the second part should be from bottom graphene to top graphene.

For GMM configuration, the diode is reversely biased, and the thermal emission from metal to graphene can be ignored.

Therefore, the current density of GMM and GMG can be given by:

$$J_{GMM} = A * T^2 \exp\left(-\frac{\varphi_b}{k_B T}\right)$$

$$J_{GMG} = A * T^2 \left(\exp\left(-\frac{\varphi_{b2}}{k_B T}\right) - \exp\left(-\frac{\varphi_{b1}}{k_B T}\right)\right)$$

where $\varphi_{b1}$ and $\varphi_{b2}$ are the barrier height at bottom and top layer graphene, respectively.

Consideration is also made of the tunneling current in GMG. The tunneling current density can be given by:

$$J = A \int Dos_B(E) \times Dos_T(E) \times T(E) \times (f(E-eV) - f(E))dE$$

where f is the Fermi distribution function, T is the transmission probability, and A is a constant.

In this tunneling model, $MoS_2$ is considered as an isotropic material although it's actually layered. Under this approximation, one obtains:

$$T(E) = \exp\left(-\frac{4\pi}{h}\int_0^d (2m_e)^{\frac{1}{2}}(eV(x) - E)^{\frac{1}{2}} dx\right)$$

where $m_e$ is the effective mass of electrons, and d is the thickness of the barrier. eV(x) describes the shape of the parabolic barrier and can be deduced by solving the equations in the previous section. It is noted that, for some parts of the barrier, it might be possible that eV(x)<E. In this case, these parts of the integral are set to be 0.

A is chosen to fit the work described in the Britnell article in order to show the difference between Schottky model and tunneling model for GMG.

Example 2

Figure 21:
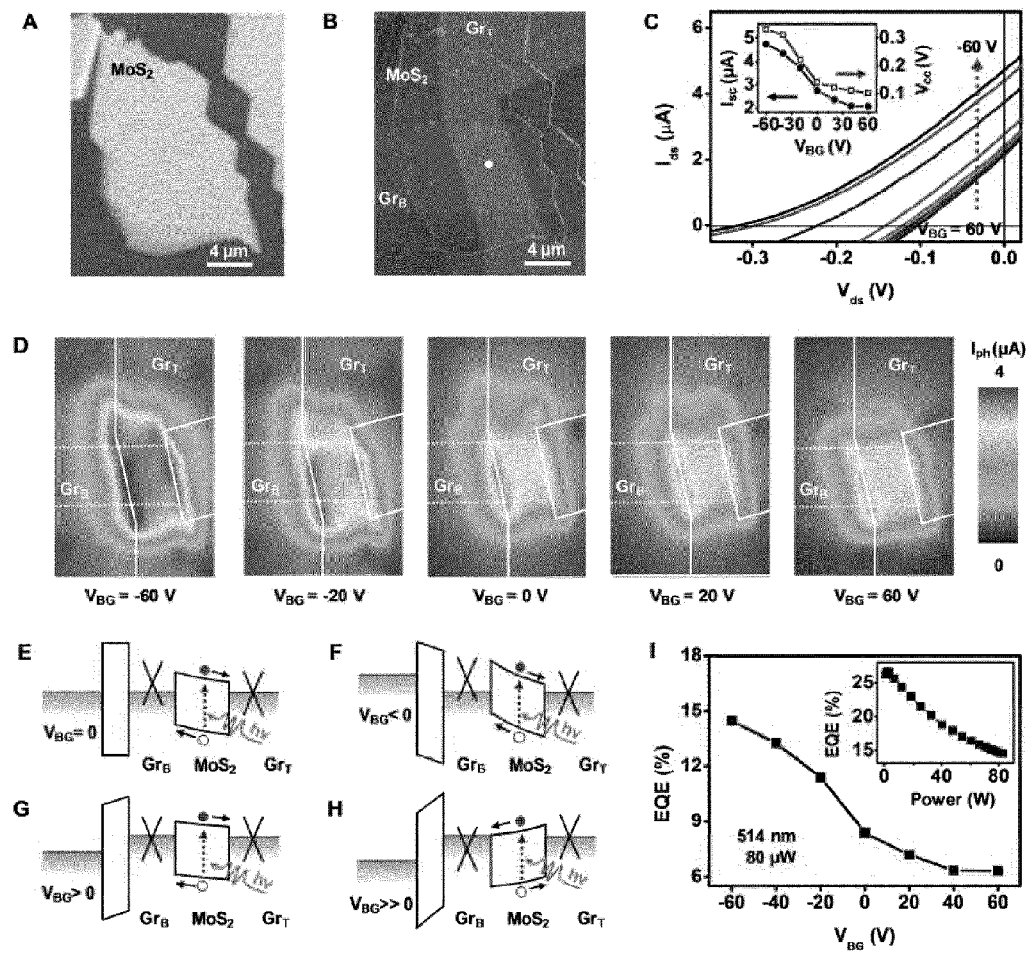
FIG. 21: (A) Optical image of vertical heterostructures with MoS$_2$ sandwiched between top and bottom graphene electrodes. (B) SEM image of the same device with the top graphene, bottom graphene and the intermediate MoS$_2$ layer. (C) I-V characteristics of the device under laser illumination (on dot in B) with variable V$_{BG}$ from −60 to +60 V in the step of 20 V. The inset shows the variation of I$_{sc}$ and V$_{oc}$ with V$_{BG}$. (D) Scanning photocurrent images taken at gate biases between −60 V and +60 V under a 514 nm laser with the excitation power of 80 µW and spot size of 1 µm. The dashed line and solid lines indicate the edge of the bottom graphene and top graphene electrodes, respectively. (E-H) Schematic band diagrams of the vertical heterostructures with (E) zero, (F) negative, (G) positive, and (H) large-positive bias on the silicon back gate. (I) External quantum efficiency (EQE) of the vertical heterostructure device as a function of back gate variation. The inset shows EQE of the vertical heterostructures device as function of the excitation laser power at V$_{BG}$=−60 V.
Figure 22:
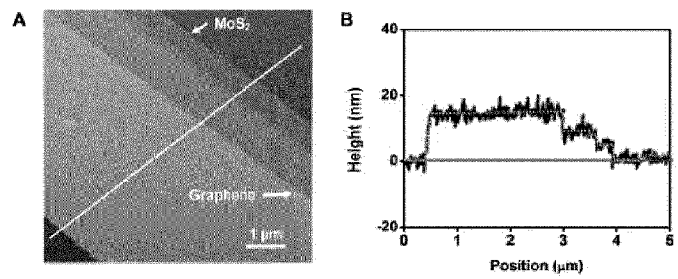
FIG. 22: (A) AFM image of graphene and MoS$_2$ stack. (B) Height profile through solid line in A.
Figure 23:
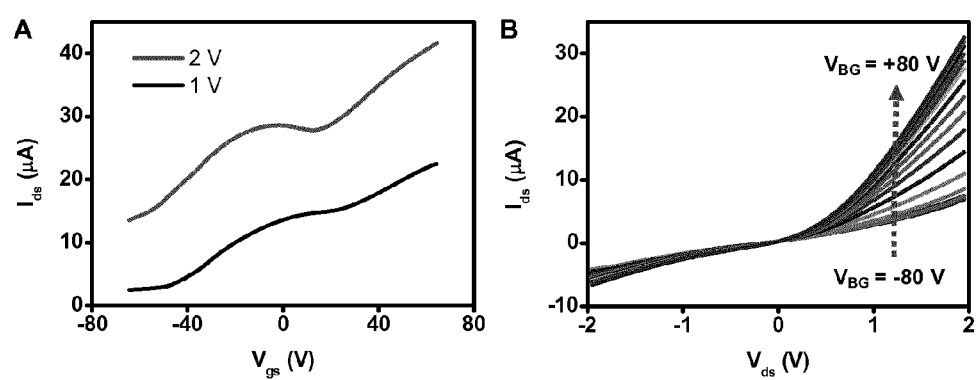
FIG. 23: (A) Transfer characteristics of vertical heterostructures device of graphene-MoS$_2$-graphene on Si/SiO$_2$ (300 nm) substrate at V$_{ds}$=1 V and 2 V. (B) Output characteristics of the same device. The back gate voltage is varied from −80 V (top) to 80 V (bottom) in the step of 10 V.

Vertically stacked heterostructures were fabricated according to the process and schematic as shown in FIG. 5 and FIG. 6. FIGS. 21A, B shows an optical image and SEM image of a typical vertical heterostructure device. A 8-μm strip of bottom graphene (FIG. 21B) is located underneath of a $MoS_2$ flake (FIG. 21B), and a top graphene (FIG. 21B) is located directly above the $MoS_2$ flake to overlap with the $MoS_2$ flake and the bottom graphene to ensure vertical charge transport. The thickness of the $MoS_2$ flake was determined by AFM to be about 20 nm (FIG. 22). The underlying silicon substrate functions as a back gate to modulate the charge transport across the graphene-$MoS_2$-graphene vertical stack. The current-voltage ($Id_s$-$V_{ds}$) measurements of the device in the dark under various back gate bias ($V_{BG}$) indicate the device exhibits n-type characteristics (FIG. 23), consistent with the n-type nature of the $MoS_2$ layer. For photocurrent measurement, the device was tested under a focused laser illumination (514 nm, 80 μW power, 1 μm spot size) with variable $V_{BG}$ from −60 V to 60V. A series of vertical current-voltage (I-V) plots show the short circuit current ($I_{sc}$) and open circuit voltage ($V_{oc}$) can be readily modulated by $V_{BG}$ (FIG. 21C), with both the $I_{Sc}$ and $V_{oc}$ increasing with negative $V_{BG}$ and decreasing with positive $V_{BG}$ (Inset of FIG. 21C).

To further probe the photo-response characteristics of the device, scanning photocurrent measurement was conducted under a confocal optical microscope. A series of scanning photocurrent ($I_{ph}$) images of the device were taken under short-circuit conditions at different $V_{BG}$ between −60 and 60 V (FIG. 21D). The bottom graphene ($Gr_B$) and top graphene ($Gr_T$) electrodes are highlighted in the photocurrent images with dashed and solid lines, respectively. Unlike graphene-based photodetectors that rely on a lateral graphene-metal junction with a rather small photo-sensing active area near the graphene-metal contact, the vertical heterostructure device shows broad area photocurrent generation throughout the entire area of the vertical graphene-$MoS_2$-graphene stack. The image taken at $V_{BG}$=+60 V displays strong photocurrent in the overlapping area of top- and bottom-graphene, demonstrating the photo-responsive area covers the entire vertical stack. With gate voltage stepping towards the negative direction, the overall photocurrent increases, and the photo-responsive area also appears to expand beyond the overlapping area between the top- and bottom-graphene. In particular, the photocurrent image at $V_{BG}$=−60 V shows that the photoresponse can be observed from the entire $MoS_2$ flake instead of just the overlapping area, suggesting that the photocarriers generated outside of the vertical stack can also be separated and contribute to the overall photocurrent, and demonstrating that the minority carrier diffusion length is at least on the micrometer scale in the devices.

Overall, the ability to modulate the photocurrent with an external back gate voltage indicates that it is possible to manipulate the photocarrier generation, separation and transportation processes in such vertically stacked devices. These experimental observations can be explained by using the band diagrams of the vertical stack under various back gate voltages (FIGS. 21E-H). Before applying a back gate voltage, the initial built-in potential is determined by the Schottky barrier height difference between top and bottom graphene-$MoS_2$ contacts. Because the channel length (20 nm) is much shorter than the typical depletion length (about 200 nm) of the graphene-$MoS_2$ Schottky barrier, the top and bottom Schottky barriers are merged together to form a monotonic slope across the entire stack, which determines the separation and transportation of the excited electrons and holes. In the device, the Schottky barrier height in the bottom graphene-$MoS_2$ contact is higher than that of the top graphene-$MoS_2$ contact, likely due to a p-doping effect of the graphene by the substrate oxide. As a result, the band slope in the $MoS_2$ layer points from the bottom contact (high potential) to the top contact (low potential) with a built-in field that drives the excited electrons to move towards the top graphene (FIG. 21E).

With the finite density of states in graphene and weak electrostatic screening effect, the bottom graphene-$MoS_2$ Schottky diode barrier height can be effectively modulated by an external field applied through the back gate electrode ($V_{BG}$). With a negative $V_{BG}$, the work function of the bottom graphene and the barrier height of the bottom graphene-$MoS_2$ Schottky junction are increased, which increases the band slope in $MoS_2$ to promote more effective separation of electron-hole pairs and enhances the photocurrent (FIG. 21F). On the order hand, a positive $V_{BG}$ decreases the bottom graphene-$MoS_2$ Schottky barrier height and reduces the overall band slope in $MoS_2$ to suppress the electron-hole separation and reduces overall photocurrent (FIG. 21G). In principle, when the positive $V_{BG}$ is large enough, the Schottky barrier height of the bottom graphene-$MoS_2$ junction can be decreased to be lower than that of the top graphene-$MoS_2$ junction, thus inverting the band slope and switching the photocurrent into the negative values (FIG. 21H). However, this switching effect is not observed in this device before dielectric break-down under increasing gate voltage, but is readily observed in dual-gated devices.

Based on the photocurrent response and input power, the external quantum efficiency (EQE) of the device under variable gate bias can be determined (FIG. 21I). The study shows the EQE can be increased from about 6% at $V_{BG}$=60 V to about 15% at $V_{BG}$=−60 V under the excitation by an 80 µW laser power. Furthermore, it is found that the EQE can be further increased to about 27% by decreasing excitation laser power to 5 µW (inset of FIG. 21I). Significantly, the EQE observed in these vertically stacked graphene-$MoS_2$-graphene devices is about two orders of magnitude higher than that of lateral graphene-metal junction photodetectors (EQE of about 0.1%).

To further probe the ability to tune the photocurrent with an external field, an additional top gate electrode is formed on top of graphene-$MoS_2$-graphene stack, using 60 nm of $HfO_2$ as an insulating dielectric layer and another layer of graphene as a transparent top gate electrode ($Gr_G$) (FIG. 24A and FIG. 6E, F). The transfer characteristics of a typical dual gated vertical hetero structure device (FIG. 24B) are shown in FIG. 24C. Each curve was obtained by sweeping the back gate bias ($V_{BG}$) from −60 to +60 V with a fixed drain-source bias ($V_{DS}$) of 100 mV and various fixed top gate bias ($V_{TG}$) from −6 to +4 V in steps of 1 V. The transfer characteristics exhibit n-type characteristics (dominated by the n-type characteristics of $MoS_2$) versus back gate bias with two kinks corresponding to the Dirac points of top graphene and bottom graphene. The Dirac points are more clearly seen at negative top gate bias (e.g., $V_{TG}$=−6V) when the $MoS_2$ channel is turned on, at which point the resistance of the bottom and top-graphene makes a significant portion of the overall resistance of the entire vertical stack. The Dirac points of the top (solid line) and bottom-graphene (dashed line) can also be highlighted by the two-dimensional image of the transconductance ($dI/dV_{BG}$) (FIG. 24D). Overall, the Dirac point of the bottom graphene is slightly shifted from $V_{BG}$=−20 V to −18 V by varying $V_{TG}$ due to the weak coupling of the bottom graphene with the top gate, while the Dirac point of the top graphene can be greatly shifted from −60 V to +50 V by varying $V_{TG}$ due to a much stronger gate coupling between the top graphene with the top gate. The Dirac points of both the top and bottom graphene are located at same $V_{BG}$ (−19 V) when $V_{TG}$=0 V. With a positive $V_{TG}$, the top-graphene Dirac point shifts to be lower than that of the bottom graphene, and with a negative $V_{TG}$, the top graphene Dirac point shifts to be higher than that of the bottom graphene.

The modulation of the Dirac points of the top and bottom graphene layer can directly impact the amplitude and direction of the band slope in the $MoS_2$ layer, as shown in the band diagrams under different top or back gate voltages (FIG. 24E-H). With a negative $V_{TG}$, the work function in the top graphene and barrier height of the top graphene-$MoS_2$ Schottky junction are increased (FIG. 24E). The top Schottky barrier is higher than the bottom one, and the band slope in $MoS_2$ points from top graphene to bottom graphene, which drives the excited electrons to move towards bottom graphene to result in a negative photocurrent. At $V_{TG}$ of about 0 V, the top graphene and bottom graphene Dirac points are matched at $V_{BG}$=−19 V, and there is no band slope and no driving force for the separation and transportation of excited electrons and holes (FIG. 24F), leading to an essentially zero photocurrent. At $V_{TG}$>0 V, the band slope in $MoS_2$ switches its direction to point from bottom to top with a built-in potential to drive the excited electrons toward the top graphene and result in a positive photocurrent (FIG. 24G). A sequence of scanning photocurrent images of the device taken under short-circuit conditions at different $V_{TG}$ between −6 and 6 V at $V_{BG}$=0 V shows that the photocurrent can be readily switched from negative values ($V_{TG}$<0) to nearly zero ($V_{TG}$~0) followed by positive values ($V_{TG}$>0) (FIG. 24I). By applying an opposite $V_{BG}$ against $V_{TG}$, the bottom Schottky barrier height and the band slope in $MoS_2$ can be additionally increased to further increase the negative photocurrent (FIG. 24H, J). Overall, with the dual-gated vertical graphene-$MoS_2$-graphene heterostructures, the amplitude of the photocurrent can be readily modulated by more than 500 folds, and polarity of the photocurrent can be completely switched.

In an alternative and more simplified picture, the generation and polarity of the photocurrent within the dual-gated vertical device can be understood without considering the details within the graphene-$MoS_2$-graphene stack. In general, the polarity and amplitude of the overall photocurrent can be largely determined by the field direction and field strength across the top and bottom gate electrodes, with the photogenerated electrons moving towards the positive biased gate electrode and holes moving towards the negative biased gate electrode. Unlike conventional photodiodes in which the photocarrier separation and transportation are dictated by the intrinsic internal built-in potential and hardly changeable with external factors, this example demonstrates that the photocarrier separation, transportation and photocurrent generation processes in the vertical graphene-$MoS_2$-graphene devices can be readily modulated with an external field, which can open up exciting opportunities for the design of photodetection and photovoltaic devices.

The above studies were based on a nearly symmetric graphene-$MoS_2$-graphene stack. An asymmetrical vertical heterostructure of graphene-$MoS_2$-Metal (Ti) (GMM) is also explored for photocurrent generation. With a bottom graphene-$MoS_2$ Schottky junction and a nearly Ohmic top $MoS_2$—Ti contact, the asymmetric device could allow for further enhancement of the photocurrent. With the opaque metal electrode on the top, the device was fabricated on a glass substrate with a 100 nm transparent indium tin oxide (ITO) film as the back gate electrode and a 30-nm $Al_2O_3$ film as the gate dielectric, to allow for the excitation laser illumination from the backside of the substrate to reach the bottom graphene-$MoS_2$ junction (FIG. 25A, B).

FIG. 25C shows an optical image of a vertical heterostructure of graphene-$MoS_2$-Metal (Ti) stack. The 8-μm strip of bottom graphene (inside of dashed line) is located underneath of the $MoS_2$ flake, and top metal (Ti) electrode is located above the $MoS_2$ flake to overlap with the bottom graphene. With this device, the top $MoS_2$—Ti forms a nearly Ohmic contact, while bottom graphene-$MoS_2$ contact forms a Schottky junction, of which the barrier height can be modulated by the back gate. In this way, the band slope in $MoS_2$ points from bottom (high) to top (low). The amplitude of the slope can be readily modulated by the potential applied through the bottom gate electrode. A negative $V_{BG}$ increases the work function of bottom graphene and the barrier height of the bottom graphene-$MoS_2$ Schottky junction (FIG. 25D), which induces additional band bending and increases the band slope in $MoS_2$ to promote the electron-hole separation and photocurrent generation. A positive $V_{BG}$ decreases the Schottky barrier height of the bottom graphene-$MoS_2$ junction and reduces band slope in $MoS_2$ to suppress the photocurrent (FIG. 25E). A sequence of scanning photocurrent images of the device taken under short-circuit conditions at variable $V_{BG}$ are shown in FIG. 47F. The measurement at $V_{BG}$=−1 V displays strong photocurrent at the overlapping area of bottom graphene and top Ti electrodes. The photocurrent gradually decreases with increasing gate voltage in the positive direction. A series of current-voltage (I-V) plots obtained under 514 nm laser illumination (80 μW power, 1 μm spot size) shows both the open circuit voltage and short circuit current increase with negative $V_{BG}$ and decreases with positive $V_{BG}$ (FIG. 25G, see also FIG. 27). EQE measurements obtained at various excitation power and wavelengths (458, 476, 488, 496, 514, 543, 596 and 633 nm) show that the EQE gradually increases with decreasing power and saturate at a power 5 μW or below (FIG. 25H). In this example, a maximum photocurrent EQE of 55% is achieved at 488 nm wavelength, a dramatic improvement from other reported graphene photodetectors.

Figure 28:
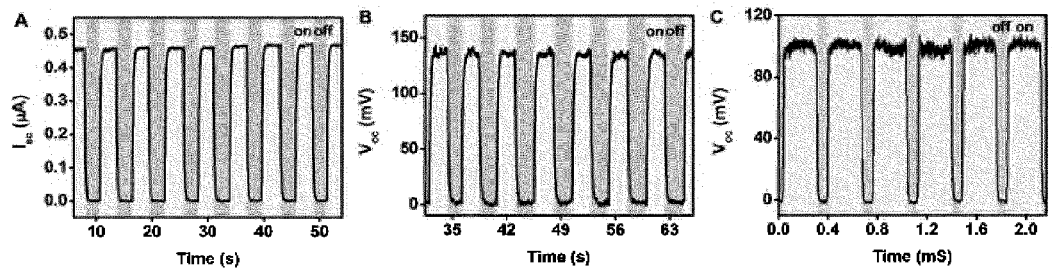
FIG. 28: (A) Photocurrent response and (B) photovoltage response under a global laser (478 nm) illumination. (C) Time dependent photovoltage measurement under a global laser (478 nm) illumination through a 2.6 kHz chopper.

Time dependent photocurrent measurements were conducted to probe the time response of the vertically stacked graphene-$MoS_2$-graphene device. These studies were conducted under a global illumination using a defocused 478 nm diode laser to cover the entire device area with alternatively laser on- and off-periods (FIG. 28). The overall photocurrent and photovoltage of the vertical device shows that photoresponse can be substantially instantly switched on and off by the laser illumination (FIG. 28A, B). Faster time response can be tested with a laser illumination through a 2.6 kHz mechanical chopper (FIG. 28C). The periodic photoresponse characteristics exhibit the same frequency as that of the mechanical chopper. The observed photocurrent on-off transition in this study is at least less than 50 μs, which is limited by the measurement capability. The intrinsic speed of the photocurrent generation is likely to be much higher.

In summary, this example demonstrates a design of vertically stacked heterostructures of layered materials for highly efficient photocurrent generation. This example shows that the vertically stacked heterostructures of graphene-$MoS_2$-graphene and graphene-$MoS_2$-metal junctions can be created with a broad area vertical junction for highly efficient photon harvesting. The finite density of states and weak screening effect of graphene allows integration of single or dual gates to modulate the band slope in $MoS_2$ and manipulate the charge generation, separation and transportation processes. Unlike conventional photodiodes in which the photocurrent is determined by the intrinsic internal built-in potential dictated by selective doping, the amplitude and polarity of the photocurrent in the gated vertical heterostructures can be readily modulated by an external gate field. The ability to use an external vertical electrical field to manipulate the charge generation and separation processes can open up new possibilities for the design of photodetection and photovoltaic devices with greatly improved efficiency.

Example 3

Figure 29:
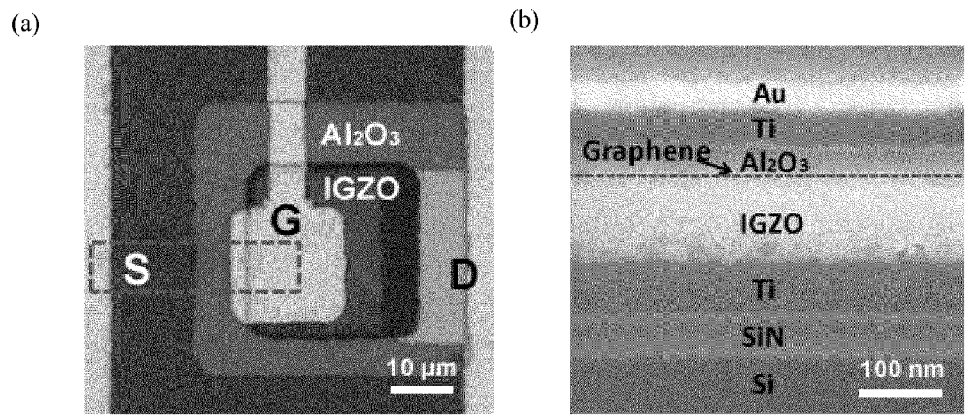
FIG. 29: Structural characterization of an IGZO VTFT. a, Optical top view image of a VTFT, including Ti/IGZO stack, Al$_2$O$_3$, Ti/Gold, and graphene as highlighted by the dashed lines. The active channel area is defined by the overlap between the graphene and IGZO. b, A cross-sectional SEM image of a VTFT, illustrating 8 layers of the vertical stack. Graphene is highlighted by dashed line.

Vertically stacked heterostructures were fabricated according to FIG. 7. An optical microscope image (FIG. 29a) and a cross-sectional SEM image (FIG. 29b) of a typical VTFT show eight distinct layers, including the entire vertical stack of Au—Ti—$Al_2O_3$-Graphene-IGZO-Ti on a silicon/silicon nitride substrate.

Figure 31:
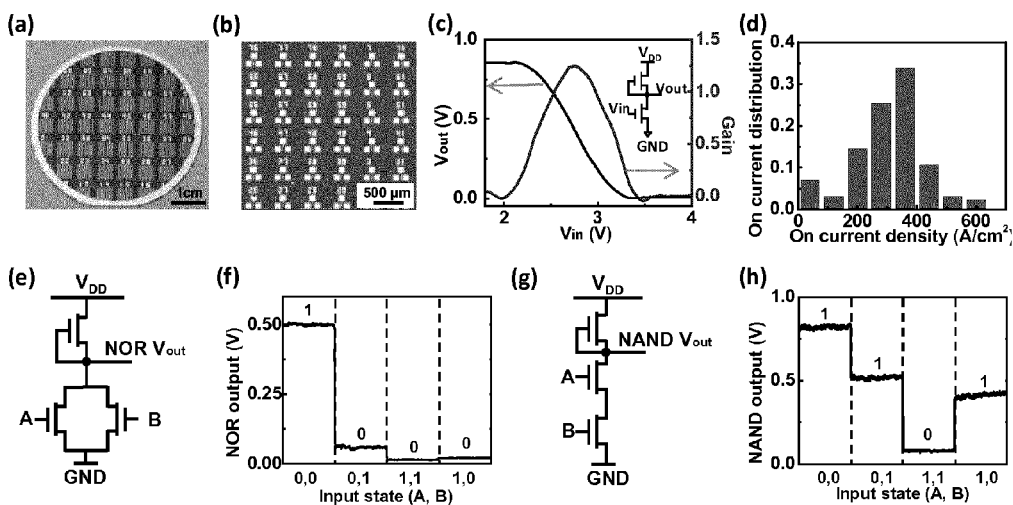
FIG. 31: Scalability and logic applications of graphene-IGZO VTFTs. a, A photograph of a 2-inch wafer with an array of 1620 VTFTs. b, An optical image of a large array of VTFTs fabricated on Si/SiN$_x$ substrate. c, A histogram of the ON-state current distribution of more than 100 randomly sampled VTFTs. d, The inverter characteristic obtained by integrating 2 VTFTs in series, with the top one as a depletion load. Power supply ($V_{DD}$) is at 1 V, and the peak gain is about 1.26. e, Schematic of a logic NOR gate obtained by integrating 3 VTFTs. f, Output voltage levels of the logic NOR gate at four typical input states and 1 V power supply ($V_{DD}$). g, Schematic of a logic NAND gate obtained by integrating 3 VTFTs. h, Output voltage levels of NAND logic gate at four typical input states at 1 V power supply ($V_{DD}$).

With the use of large area CVD graphene and the scalability of a RF sputtering process, the integration strategy is intrinsically compatible with conventional photolithography-based microfabrication process, and can be readily implemented on the wafer scale in high yield, allowing the fabrication of a large array of VTFTs (>1600 VTFTs) and functional logic circuits on a 2-inch wafer (see below, FIG. 31a-c).

Figure 32:
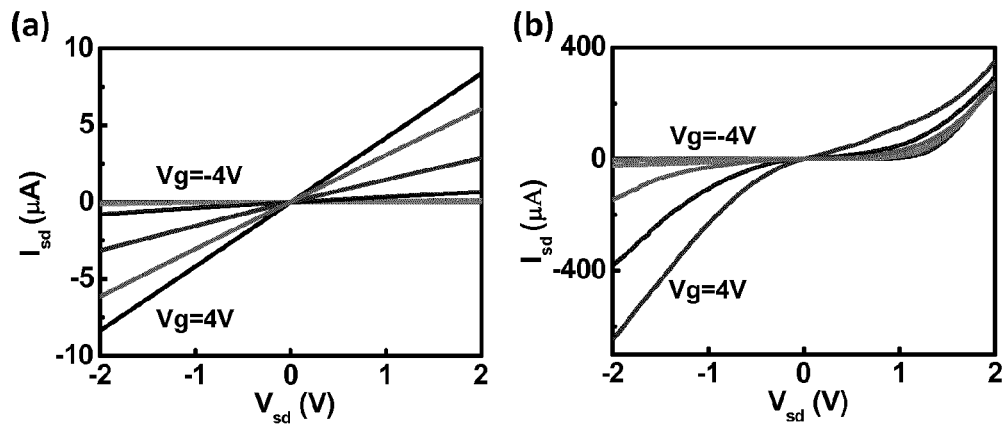
FIG. 32: a, $I_{sd}$-$V_{sd}$ (output characteristic) curve of a conventional planar IGZO TFT at various gate voltages. The device channel area is 10×10 μm². b, $I_{sd}$-$V_{sd}$ (output characteristic) curve of a IGZO VTFT at various gate voltages. The device channel area is also 10×10 μm². The gate voltage step is 1 V.

Electrical transport studies of the as-fabricated VTFTs were carried out at room temperature under ambient conditions. The output characteristic of a VTFT with a 100-nm thick IGZO film shows that the source-drain current increases with increasing positive gate voltage (FIG. 30d), indicating that electrons are the majority charge carrier in this vertical transistor, consistent with the n-type semiconducting behavior observed in α-IGZO thin film. Overall, the VTFT showed an exceptionally high current exceeding 600 μA for a 10×10 μm device, which is at least two orders of magnitude larger than that of a planar IGZO TFT with a similar sized footprint (FIG. 32). The device can also be completely switched off in the negative bias direction with a negative gate voltage to achieve the highest ON-OFF current ratio exceeding $10^5$, sufficient for high performance logic operations.

Figure 33:
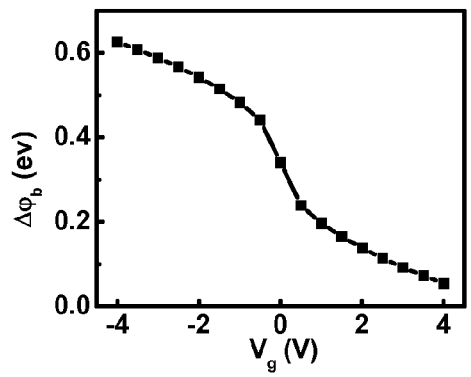
FIG. 33: Graphene-IGZO barrier height at various gate voltages. The barrier can be tuned from 640 mV (−4 V gate) to 40 mV (4 V gate).
Figure 34:
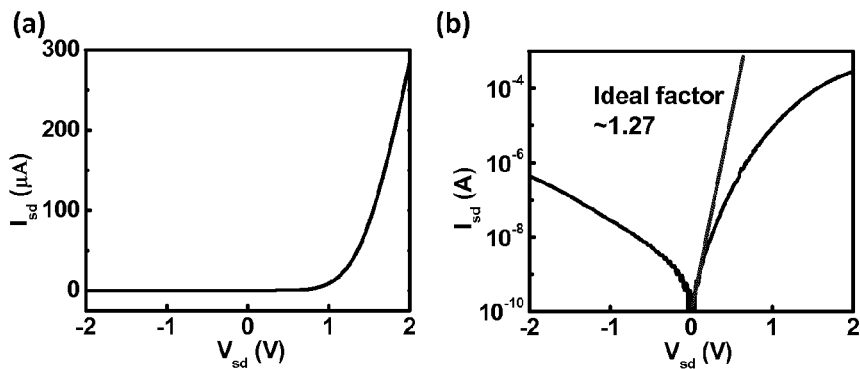
FIG. 34: a, $I_{sd}$-$V_{sd}$ curve of graphene-IGZO VFETs at OFF state ($V_g$=4 V), showing a current rectification behavior. b, Semilog plot of a, showing the ideal factor of about 1.27.

In general, the gate voltage applied across the vertical stack can modulate the doping level or work function of the graphene (FIG. 30a-c), as well as the charge concentration in the IGZO layer and the relative Schottky barrier height/width across the graphene and IGZO interface. A negative gate voltage increases the work function of graphene and the Schottky barrier height with n-type IGZO. At $V_g$=−4 V, the Schottky barrier height is increased to about 640 mV (FIG. 30b) (see also FIG. 33). At this point, the graphene-IGZO junction behaves as a Schottky diode with an ideal factor as small as 1.27 (FIG. 34), where a full current rectification is observed with the current in the negative direction completely switched off With increasing gate voltage towards the positive direction, the work function of graphene is reduced and so does the Schottky barrier height with IGZO, thus greatly enhancing the current at the negative bias. At $V_g$=4 V, the barrier height between graphene and IGZO is reduced to about 40 mV (FIG. 33), the VTFT is switched to the ON-state (FIG. 40c), and its output characteristic shows nearly linear Ohmic behavior.

Because the gate modulation is achieved by tuning the electron barrier height at the graphene-IGZO interface, the VTFT typically shows asymmetric transfer characteristics. In the reverse biased region with a negative bias to the top graphene electrode (FIG. 40e), the electrons are injected from graphene into IGZO (inset, FIG. 30e), where the current is strongly dependent on the barrier height $\phi_b$ according to the equation:

$$I_{sat} = AA^*T^2 \exp\left(\frac{-q\varphi_b}{kT}\right)$$

where A is the Schottky junction area, A* is the effective Richardson constant, q is the element charge, k is the Boltzmann constant and T is the temperature. In this case, the current increases exponentially with the decreasing barrier height. This leads to a very large ON-OFF current ratio over $10^5$ at a source drain bias of −0.1 V. Increasing the bias in the negative direction increases the current density but with a small drop in the ON-OFF current ratio, which could be attributed to the large bias induced barrier lowering effect.

In the forward biased region with a positive voltage applied to the graphene electrode, the transfer characteristics can be separated into two parts. In the small forward bias region where $V_{sd} < \phi_b$ (FIG. 30f, right inset), the current is still limited by the electron diffusion across the graphene-IGZO barrier, resulting in a small current at OFF-state and a large current modulation (ON-OFF ratio>$10^3$). While in the large forward bias region ($V_{sd} > \phi_b$) (FIG. 30f, left inset), source drain bias overcomes the graphene-IGZO barrier, at which point the electrons can be directly injected into graphene without significant influence from graphene-IGZO barrier and gate voltage, leading to a large current density and small ON-OFF current ratio. According to band diagram, the current limitation in this region comes from the small barrier formed between Ti and IGZO.

Figure 30:
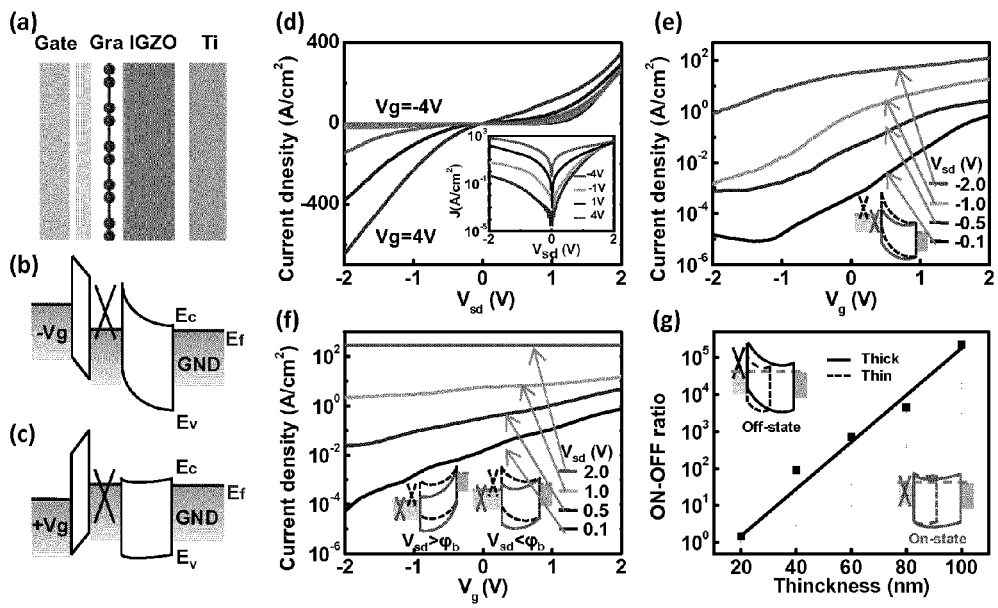
FIG. 30: Room temperature electrical properties of VTFTs. a, A schematic layout of layers of the vertical transistor. Gate electric field is applied from left gate electrode on top of graphene and grounded Ti electrode. b, c, The band structure under negative gate voltage (b) and positive gate voltage (c) at zero source-drain bias. d, $I_{sd}$-$V_{sd}$ output characteristics of a VTFT at various gate voltages from −4 V to +4 V (1 V step). The log plot is shown in the insets with various gate voltages (−4, −1, +1, +4 V). The current is normalized by the area. e, $I_{sd}$-$V_g$ transfer characteristics of the device shown in d in reverse region where $V_{sd}$=−0.1, −0.5, −1 and −2 V. The band diagram of the corresponding ON- and OFF-state at negative bias is shown in the inset. f, $I_{sd}$-$V_g$ transfer characteristics of the device shown in d in positive bias region where $V_{sd}$=0.1, 0.5, 1 and 2 V. The band diagrams of the corresponding ON- and OFF-state at small positive bias ($V_{sd}<\phi_b$) (right inset) and at large positive bias ($V_{sd}>\phi_b$) (left inset). g, The ON-OFF current ratio of the VTFTs with various channel length (IGZO thickness) at a source-drain bias of −0.1 V. The inset shows the band diagrams for thick (solid) and thin (dashed) IGZO film at ON- and OFF-state, respectively.

Investigation was conducted on the channel length (the thickness of the IGZO thin film) scaling relation of the VTFTs. FIG. 30g shows the room-temperature ON-OFF current ratios of the VTFT as a function of different IGZO thickness at a source drain bias of −0.1 V. The ON-OFF current ratios are strongly dependent on the IGZO film thickness. In general, it is found that large ON-OFF ratios over $10^5$ can be achieved with thick IGZO (e.g., 100 nm thickness), which gradually decreases to 2 when the IGZO thickness is reduced to 20 nm. This trend can be explained by a short-channel effect. With the decreasing IGZO thickness, the potential of the entire channel becomes more and more dominated by the electric field of the Ti metal electrodes, which can reduce the OFF-state graphene-IGZO Schottky barrier height, resulting in a smaller ON-OFF current ratio (FIG. 30g, insets).

The above studies demonstrate that high performance VTFTs can be achieved with high ON-OFF ratio using the graphene-IGZO heterostructures. To further evaluate the scalability and reproducibility of the integration strategies, an array of VTFTs was fabricated with over 1600 devices on a 2-inch wafer (FIG. 31a,b). Of note, the process exhibits a high yield over 85% across the entire wafer. Instances of failure mostly result from broken graphene due to an un-optimized transfer process, which can be improved upon optimizing the transfer techniques or using multiple layers of graphene. Also, the VTFTs fabricated from the process display excellent consistency in the device characteristics with relatively uniform current density across the entire wafer. The histogram of ON-current distribution of more than 100 randomly sampled vertical transistors show an average current density of 305 A/cm$^2$ with standard deviation 118 A/cm$^2$ (FIG. 31c).

The high yield fabrication of VTFTs with large ON-OFF ratio on the wafer scale can allow the integration of multiple VTFTs into functional circuits. For example, a NMOS logic inverter can be achieved with two VTFTs connected in series, where gate and drain of a top VTFT is connected to make a depletion load. At 1 V source-drain bias, the inverter displays sharp switching behavior with a gain of 1.26 (FIG. 31d). Taking a step further, more complicated logic function can be created by connecting more VTFTs together. For example, a logic NOR or NAND function can be created using 3 VTFTs, respectively (FIG. 31e,g). The measured input and output voltages demonstrate the correct logic function for the NOR and NAND gate (FIG. 31f,h). Overall, these results demonstrate that the VTFTs can provide a scalable pathway to high performance logic applications.

Figure 35:
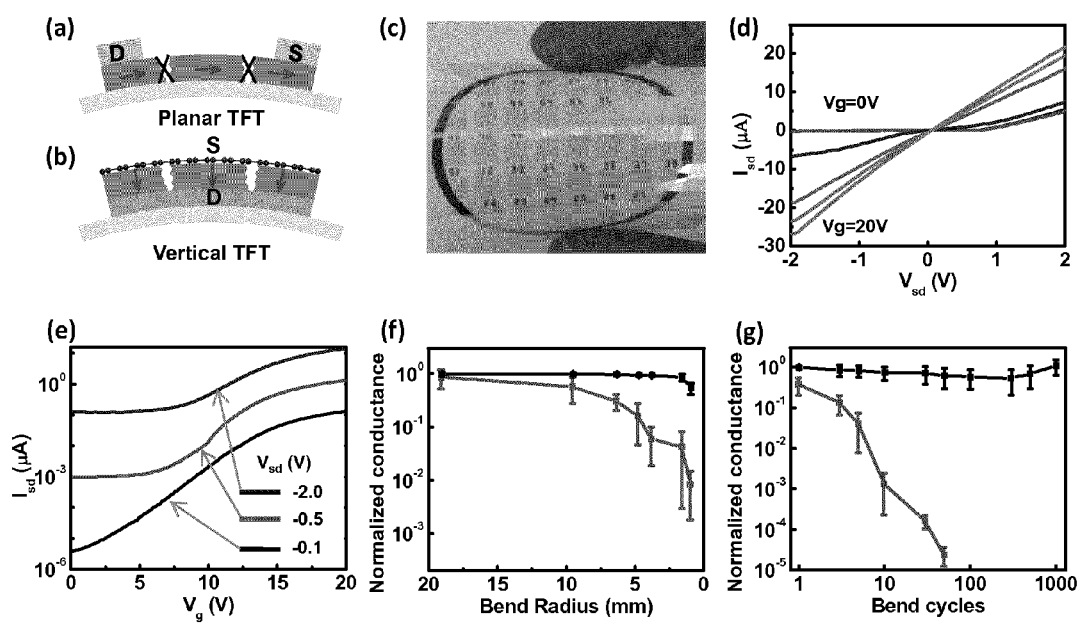
FIG. 35: VTFT as an architecture for highly robust flexible electronics. a, b, Schematics of device operation of a planar TFT and VTFT on a flexible plastic substrate. Arrows indicate current flow across channel, which can be severely limited by cracks in the planar TFT, but not affected in the VTFT. c, Photograph of a large array of VTFTs integrated on a polyethylene terephthalate (PET) substrate. d, $I_{sd}$-$V_{sd}$ output characteristics of a VTFT on a PET substrate at various gate voltages from 0 to 20 V (4 V step). e, $I_{sd}$-$V_g$ transfer characteristics of the device shown in d in reverse region where $V_{sd}$=−0.1, −0.5 and −2 V. f, Normalized conductance at various bending radius for planar TFT (bottom curve) and VTFT (top curve). g, Normalized conductance at various bending cycles for the planar structure (bottom curve) and vertical structure (top curve), highlighting greater robustness of the VTFT architecture. All the data are obtained from the average of 8 typical tested devices.

For macroelectronic applications, there is increasing interest in applying functional electronic circuits on large area plastic substrate for flexible electronics. The function of active transistors on plastic substrate is however often constrained by the intrinsic material performance (e.g., very low carrier mobility of conventional inorganic or organic thin film semiconductors) or insufficient mechanical robustness (e.g., extreme brittleness of ceramic IGZO film). In particular, the brittle nature of IGZO film makes it undesirable for flexible electronics according to other approaches because any small in-plane crack of the IGZO thin film can severely degrade the lateral charge transport in conventional planar IGZO TFTs (FIG. 35a). In contrast, with the design of graphene-IGZO heterostructure based VTFTs, the current transport across the vertical direction is largely unaffected by the in-plane crack in the IGZO film (FIG. 35b). It can therefore allow a new pathway to high performance flexible electronics using a brittle material.

Additionally, since the entire fabrication process is conducted essentially at room temperature, VTFTs can be fabricated on a plastic substrate using the same or similar processing operations (FIG. 35c). Indeed, devices made on a polyethylene terephthalate (PET) substrate exhibit similar output characteristic to those on a silicon wafer (FIG. 35d). In general, when applying negative gate voltage, a large Schottky barrier is formed, and the device shows nearly ideal diode behavior. With positive gate bias, the VTFT is turned on with linear Ohmic characteristics. The transfer characteristics show that a large ON-OFF current ratio exceeding $10^4$ can be achieved for flexible logic applications (FIG. 35e).

Studies were performed to compare the mechanical robustness of the VTFTs with conventional planar TFTs under increasing bending stress (decreasing bending radius) or repeated bending cycles. The mechanical failure of inorganic TFTs under bending is generally associated with the strain-induced cracking or buckling in the films. These cracking or slip could severely limit the lateral current flow across the channel in conventional planar TFTs (FIG. 35a), resulting in a smaller current, larger resistance and the mechanical failure of the devices. However, within the VTFT architecture, the current flows vertically from the bottom-Ti to top-graphene electrode, and those lateral cracks no longer pose obstacles for the current flow (FIG. 35b). This can be demonstrated in the bending test at various bending radius (FIG. 35f). As expected, the conventional TFTs with planar device structure suffer large conductance drop with reducing bending radius (<10 mm), resulting from the strain induced in-plane crack of the IGZO channel. In contrast, the VTFTs are not much influenced with stable current delivery until a bending radius as small as 1-2 mm.

Studies were performed to compare the planar TFTs and VTFTs under repeated bending cycle test at a fixed bending radius of 5 mm (FIG. 35g). For the planar TFTs, the current drops by about 5 orders of magnitude from their initial state within 50 bending cycles due to the formation of small cracks or dislocations inside the channel under repeated bending cycles. Further increasing the bending cycles leads to the complete device failure, suggesting the formation of a continuous crack cross the channel area. On the contrary, the VTFTs are much more robust under repeated bending cycles. The current level show little change up to 1000 bending cycles. These bending test studies demonstrate the overall robustness of VTFTs under large bending curvature or repeated bending cycles and its advantages for flexible electronics.

In summary, this example demonstrates a design of high performance VTFTs based on graphene-IGZO junction. The vertical device architecture takes advantage of high mechanical strength of graphene and the vertical current flow to ensure high delivering current and overcome the bending limitation of conventional planar inorganic TFTs, thereby providing a transistor technology that is highly tolerant to repeated mechanical bending. The approach is intrinsically scalable and can be extended to a wide range of semiconductor thin films including the solution processible ones to allow a low-temperature, low cost process to high performance VTFTs on plastic substrates, and thus provides a pathway to high performance macroelectronics. With a combination of high current density, high ON-OFF current ratio, exceptional flexibility and wafer scale process, the VTFTs satisfy the practical conditions for high performance logic applications for a wide range of flexible, wearable and disposable electronics.

Methods

Synthesis and Characterization.

Thin film gold (20 nm thick) is e-beam deposited first as a drain electrode on a SiN/Si substrate. Ti thin film (60 nm thick) with an area of 30×30 μm is then DC sputtered on top of a pre-patterned gold electrode using Denton Discovery 550 sputter, followed by RF sputtering of IGZO thin film without breaking vacuum. Graphene was grown by CVD on a copper foil at 1050° C. with methane as a carbon source. After growth, the graphene was transferred onto IGZO substrate and patterned into 50×10 μm strips by oxygen plasma etching. $Al_2O_3$ is e-beam deposited as a gate dielectric. Finally, Ti/Au thin film electrode (50 nm/50 nm) is deposited as source and gate electrodes.

Microscopic and Electrical Characterization.

A cross-sectional sample was cut by Focused Ion Beam (FIB) and characterized using Nova 600 SEM. The D.C. electrical transport studies were conducted with a probe station at room temperature under ambient conditions with a computer-controlled analog-to-digital converter. Bending test is conducted using self-designed clap and measured using probe station at room temperature under ambient conditions.

Graphene-IGZO Barrier Height as a Function of Gate Voltage.

The graphene-IGZO barrier height is estimated by the difference between IGZO and graphene:

$$\Delta \varphi_b = W_{gra} - W_{IGZO}$$

$$W_{gra} = W_d \pm \hbar v_f \sqrt{\pi N}$$

$$N = C_{ox} V = \frac{\xi}{d} V$$

$W_{IGZO}$=4.16 eV is the work function of IGZO. $W_{gra}$ is the work function of graphene, which can be tuned by top gate voltage. $v_f$ is the Fermi velocity of $10^6$ m/s. N is the carrier density of graphene. ξ is the dielectric constant of $Al_2O_3$, and d is the thickness of the top gate dielectric.

As used herein, the singular terms "a," "an," and "the" include plural referents unless the context clearly dictates otherwise. Thus, for example, reference to an object can include multiple objects unless the context clearly dictates otherwise.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±5%, such as less than or equal to ±4%, less than or equal to ±3%, less than or equal to ±2%, less than or equal to ±1%, less than or equal to ±0.5%, less than or equal to ±0.1%, or less than or equal to ±0.05%.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, operation or operations, to the objective, spirit and scope of the invention. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations is not a limitation of the invention.

What is claimed is:

1. A vertically stacked heterostructure device, comprising:
a substrate; and
vertically stacked layers disposed over the substrate and including
a source electrode including a layer of graphene;
a drain electrode; and
a semiconducting channel disposed between the source electrode and the drain electrode, the semiconducting channel including a material different from graphene,
wherein, during operation of the device, a current is configured to flow between the source electrode and the drain electrode through the semiconducting channel.

2. The vertically stacked heterostructure device of claim 1, further comprising a dielectric layer disposed over the substrate, and the substrate corresponds to a back gate.

3. The vertically stacked heterostructure device of claim 2, further comprising a voltage source connected to the substrate to apply a back gate voltage.

4. The vertically stacked heterostructure device of claim 2, wherein the source electrode is disposed over the dielectric layer, the semiconducting channel is disposed over the source electrode, the drain electrode is disposed over the semiconducting channel, and at least a portion of the drain electrode overlies at least a portion of the source electrode to define an overlapping area.

5. The vertically stacked heterostructure device of claim 4, wherein the semiconducting channel includes at least one of a transition metal dichalcogenide or a transition metal oxide.

6. The vertically stacked heterostructure device of claim 4, wherein a thickness of the semiconducting channel corresponds to a channel length.

7. The vertically stacked heterostructure device of claim 4, wherein the drain electrode includes a metal.

8. The vertically stacked heterostructure device of claim 4, further comprising a voltage source connected to the source electrode to apply a source-drain voltage.

9. The vertically stacked heterostructure device of claim 4, wherein the device has an on-current density of at least 1,000 A/cm$^2$, and a room temperature on-off current ratio of at least 1,000.

10. The vertically stacked heterostructure device of claim 1, wherein the drain electrode is disposed over the substrate, the semiconducting channel is disposed over the drain electrode, the source electrode is disposed over the semiconducting channel, and at least a portion of the source electrode overlies at least a portion of the drain electrode to define an overlapping area.

11. The vertically stacked heterostructure device of claim 10, wherein the vertically stacked layers further include a top gate disposed over the source electrode.

12. The vertically stacked heterostructure device of claim 11, further comprising a voltage source connected to the top gate to apply a top gate voltage.

13. The vertically stacked heterostructure device of claim 11, wherein the semiconducting channel includes a thin film, semiconductor material.

14. The vertically stacked heterostructure device of claim 11, wherein a thickness of the semiconducting channel corresponds to a channel length.

15. The vertically stacked heterostructure device of claim 11, wherein the drain electrode includes a metal.

16. The vertically stacked heterostructure device of claim 11, further comprising a voltage source connected to the source electrode to apply a source-drain voltage.

17. The vertically stacked heterostructure device of claim 11, wherein the device has an on-current density of at least 600 A/cm$^2$, and a room temperature on-off current ratio of at least 10,000.

18. The vertically stacked heterostructure device of claim 1, wherein the substrate is a flexible substrate.

19. A method of photocurrent generation, comprising:
providing a vertical stack of layers disposed over a substrate, wherein the vertical stack of layers includes a top electrode, a bottom electrode, and a semiconducting channel disposed between the top electrode and the bottom electrode, the semiconducting channel includes a material different from graphene, and at least one of the top electrode and the bottom electrode includes a layer of graphene; and
generating a photocurrent by illuminating the vertical stack of layers, wherein the photocurrent flows between the top electrode and the bottom electrode through the semiconducting channel, and generating the photocurrent includes applying a back gate voltage to the substrate to modulate the photocurrent.

20. The method of claim 19, wherein the vertical stack of layers further includes a top gate disposed over the top electrode, and generating the photocurrent further includes applying a top gate voltage to the top gate to modulate the photocurrent.

* * * * *